(12) United States Patent (10) Patent No.: US 10,234,712 B2
Nakagawa et al. (45) Date of Patent: Mar. 19, 2019

(54) METHOD FOR PRODUCING LIQUID CRYSTAL DISPLAY APPARATUS WITH A UNIFORM CELL GAP

(71) Applicant: SAKAI DISPLAY PRODUCTS CORPORATION, Sakai-shi, Osaka (JP)

(72) Inventors: Hidetoshi Nakagawa, Sakai (JP); Akihiro Yamamoto, Sakai (JP); Yoshitaka Okumoto, Sakai (JP); Tokuyoshi Awa, Sakai (JP); Taiki Hayai, Sakai (JP)

(73) Assignee: Sakai Display Products Corporation, Sakai-shi, Osaka (JP)

( * ) Notice: Subject to any disclaimer, the term of this patent is extended or adjusted under 35 U.S.C. 154(b) by 0 days.

(21) Appl. No.: 15/651,044

(22) Filed: Jul. 17, 2017

(65) Prior Publication Data

US 2017/0315390 A1 Nov. 2, 2017

Related U.S. Application Data

(63) Continuation of application No. PCT/JP2015/051406, filed on Jan. 20, 2015.

(51) Int. Cl.
*G02F 1/1335* (2006.01)
*G02F 1/1339* (2006.01)
(Continued)

(52) U.S. Cl.
CPC ............ *G02F 1/1335* (2013.01); *G02B 5/20* (2013.01); *G02F 1/1339* (2013.01); *G02F 1/13394* (2013.01); *G02F 1/133516* (2013.01); *G03F 7/2016* (2013.01); *G02F 2001/13396* (2013.01); *G02F 2001/13398* (2013.01)

(58) Field of Classification Search
CPC combination set(s) only.
See application file for complete search history.

(56) References Cited

U.S. PATENT DOCUMENTS

2013/0016317 A1\* 1/2013 Waratani ............. G02F 1/13394
349/155
2016/0109751 A1\* 4/2016 Nakagawa ............. G02B 5/201
349/106

FOREIGN PATENT DOCUMENTS

JP 1-108502 4/1989
JP 2000-66235 3/2000
(Continued)

OTHER PUBLICATIONS

Int'l. Search Report issued in Int'l. App. No. PCT/JP2015/051406, dated Apr. 7, 2015.

*Primary Examiner* — Lauren Nguyen
(74) *Attorney, Agent, or Firm* — Greer Burns & Crain Ltd.

(57) ABSTRACT

A method produces a liquid crystal display. The display includes a plurality of pixels having sub-pixels that include one opening and one color layer. Some of the sub-pixels having the same color are continuously spaced in one direction. In the method, overlapping photolithographic patterns produce mask openings in which a color layer in two spaced adjacent sub-pixels is to be formed. The mask openings each have a size corresponding to two or more adjacent sub-pixels; and the number of sub-pixels of the same color that are continuously arranged in the one direction is at least twice the total number of sub-pixels of the same color included in each of the pixels.

2 Claims, 28 Drawing Sheets

(51) Int. Cl.
*G02B 5/20* (2006.01)
*G03F 7/20* (2006.01)

(56) References Cited

FOREIGN PATENT DOCUMENTS

| | | |
|---|---|---|
| JP | 2012-27328 | 2/2012 |
| JP | 2014-006363 A | 1/2014 |
| WO | WO2014-132819 A | 9/2014 |

* cited by examiner

FIG.29
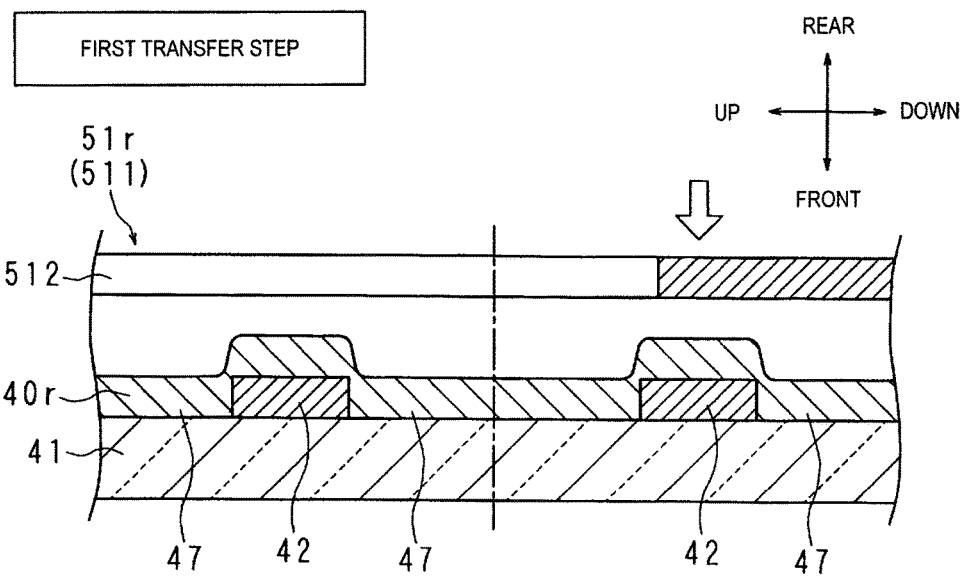
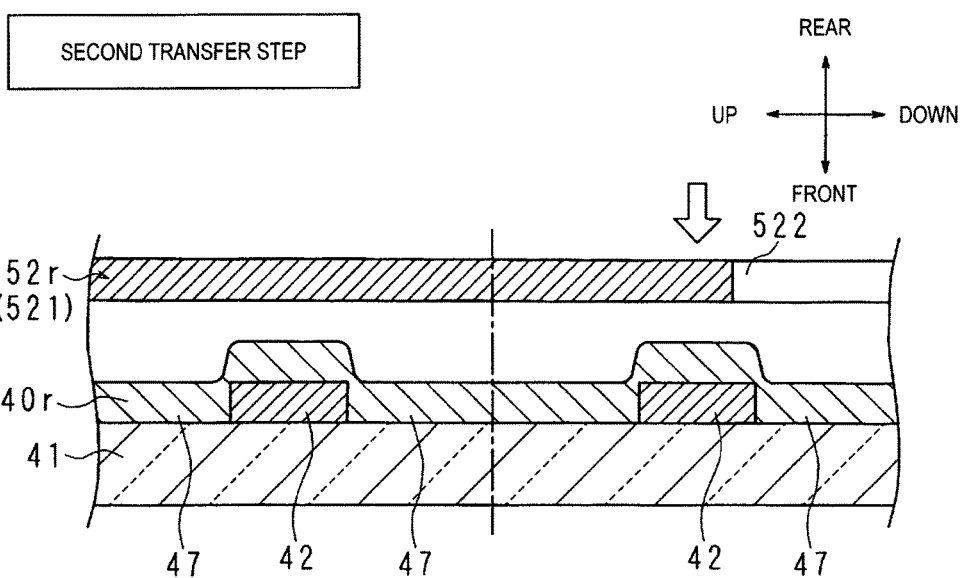

METHOD FOR PRODUCING LIQUID CRYSTAL DISPLAY APPARATUS WITH A UNIFORM CELL GAP

This is a continuation of International Application No. PCT/JP2015/051406, with an international filing date of Jan. 20, 2015, the entire contents of which are hereby incorporated by reference.

BACKGROUND OF THE INVENTION

1. Field of the Invention

The present disclosure relates to a method for producing a liquid crystal display apparatus including spacers provided between two plate-like members, and an exposure mask.

2. Description of the Related Art

A liquid crystal display apparatus includes a TFT substrate that drives a liquid crystal material and a counter substrate facing the TFT substrate. The liquid crystal material is enclosed between the counter substrate and the TFT substrate.

The counter substrate includes a light-transmissive plate, a light blocking layer formed on one surface of the light-transmissive substrate, and a color layer having three primary colors of RGB, four primary colors of RGBY, four primary colors of RGBW or the like. In the following description, the color layer has the RGB three primary colors, for example.

The light blocking layer has a plurality of openings. The openings are non-light blocking portions, and regions between openings adjacent to each other are light blocking portions.

The openings formed in the light blocking layer are each closed by a color layer of any one of the RGB three primary colors. Such a color layer is formed along a peripheral portion of, and inside, the opening in order to guarantee that the opening is closed.

Spacers are provided between the counter substrate and the TFT substrate in order to keep the distance between the counter substrate and the TFT substrate (cell gap) uniform.

Pixels provided in the counter substrate each include sub pixels for the RGB three primary colors. One sub pixel includes an opening in the light blocking layer and a color layer closing the opening.

In the case where each pixel is a multi-pixel including two sub pixels for each color (namely, six sub pixels in total), each multi-pixel includes spacers. Hereinafter, two sub pixels of a same color included in each multi-pixel will be referred to as "two same-color sub pixels".

The spacers are each provided to stand on, for example, the light blocking portion between two same-color sub pixels.

In order to form a color layer of each color by photolithography, a plurality of exposure masks each having a mask pattern corresponding to the color layer of one color are used. The mask pattern includes a plurality of openings.

In a central portion of each exposure mask, the mask pattern has a constant density of openings. In one end portion of one exposure mask, the openings are dense in a portion close to the central portion and become gradually coarse toward a peripheral portion. In an end portion, of another exposure mask, facing the one end portion of the one exposure mask, the openings are coarse in a peripheral portion and become gradually dense toward the central portion. The coarse-dense pattern of the openings in the one end portion of the one exposure mask, and the coarse-dense pattern of the openings in the above-mentioned end portion of the other exposure mask, complement each other (see Japanese Laid-Open Patent Publication No. 2000-66235).

After the light blocking layer is formed on one surface of the light-transmissive plate, the one surface is covered with a color material layer.

Next, the color material layer is subjected to photolithography by use of the one exposure mask and the other exposure mask sequentially. As a result, the mask patterns of the exposure masks are transferred to the color material layer. A region of the color material layer where the mask pattern of the one exposure mask is transferred, and a region of the color material layer where the mask pattern of the other exposure mask is transferred, partially overlap each other.

Then, a non-exposed region of the color material layer is removed.

Now, a case where the color layers corresponding to two same-color sub pixels are both formed by patterning by use of one of the one exposure mask and the other exposure mask, and a case where one of the color layers corresponding to two same-color sub pixels is formed by patterning by use of the one exposure mask and the other of the color layers is formed by patterning by use of the other exposure mask, will be compared. In the latter case, the thickness difference between a region between two same-color sub pixels and a region between another two same-color sub pixels is larger than in the former case.

In the case where the thickness difference between the region between two same-color sub pixels and the region between another two same-color sub pixels is large, the cell gap is not made uniform when spacers are located in a region between each two same-color sub pixels.

Namely, if spacers are located in a portion where the color layer patterned by use of the one exposure mask and the color layer patterned by use of the other exposure mask are adjacent to each other (so-called mask joint), the display quality of the liquid crystal display apparatus may be decreased.

However, it is not practical to adjust the length of the spacer in accordance with the thickness difference.

The present invention, made in light of the above-described situation, has an object of providing a method for producing a liquid crystal display apparatus that uniformizes the cell gap, and an exposure mask usable for the method.

SUMMARY OF THE INVENTION

A method for producing a liquid crystal display apparatus according to an embodiment of the present invention is a method for producing the liquid crystal display apparatus including two plate-like members facing each other while having a liquid crystal layer therebetween; and spacers between the plate-like members. One of the two plate-like members includes a light blocking layer including a plurality of openings; one of the two plate-like members includes color layers closing the plurality of openings or located to face the plurality of openings; a plurality of pixels each including a plurality of sub pixels each including the opening and the color layer are provided; a plurality of sub pixels included in the plurality of pixels include a number of sub pixels of a same color that are continuously arranged in one direction; and the spacers each are located between two sub pixels of a same color located adjacent to each other in the one direction. The method includes a color layer formation step of forming the color layers. The color layer formation step includes a material layer formation step of forming a color material layer of one color; a first transfer step of performing photolithography by use of a first exposure mask having a first mask pattern corresponding to a color layer of one color among the color layers, the color layer closing a part of the plurality of openings or being located to face the part of the plurality of openings, thereby transferring the first mask pattern to a first area of the color material layer; a second transfer step of performing photolithography by use of a second exposure mask having a second mask pattern corresponding to a color layer of one color among the color layers, the color layer closing another part of the plurality of openings or being located to face the other part of the plurality of openings, thereby transferring the second mask pattern to a second area of the color material layer, the second area partially overlapping the first area; and a removal step of removing a non-exposed region of the color material layer after the first transfer step and the second transfer step. The material layer formation step, the first transfer step, the second transfer step and the removal step are repeated for a plurality of colors; at least one of the first mask pattern and the second mask pattern includes mask openings in each of which the color layer, included in two sub pixels of a same color that are adjacent to each other interposing each of the spacers therebetween, is to be formed; the mask openings each have a size corresponding to two or more of sub pixels of a same color that are continuously arranged in the one direction; and the number of the two or more of sub pixels of a same color that are continuously arranged in the one direction is two times or more of a total number of sub pixels of a same color included in each of the plurality of the pixels.

According to method for producing a liquid crystal display apparatus of an embodiment of the present invention, the pixels are multi-pixels each including two sub pixels of a same color; and the two or more of sub pixels of a same color that are continuously arranged in the one direction are two sub pixels included in at least one multi-pixel and one sub pixel included in each of two multi-pixels.

An exposure mask usable for producing a liquid crystal display apparatus is an exposure mask usable for producing the liquid crystal display apparatus including two plate-like members facing each other while having a liquid crystal layer therebetween. One of the two plate-like members includes a light blocking layer including a plurality of openings; one of the two plate-like members includes color layers closing the plurality of openings or located to face the plurality of openings; a plurality of pixels each including a plurality of sub pixels each including one of the plurality of openings and one of the plurality of color layer are provided; and a plurality of sub pixels included in the plurality of pixels include a number of sub pixels of a same color that are continuously arranged in one direction. The exposure mask has a mask pattern usable to form a color layer of one color among the color layers by photolithography. The mask pattern includes mask openings each having a size corresponding to two or more of sub pixels of a same color that are continuously arranged in the one direction; and the number of the two or more of sub pixels of a same color that are continuously arranged in the one direction is two times or more of a total number of sub pixels of a same color included in each of the plurality of the pixels.

According to an embodiment of the present invention, the photolithography is performed by use of the first exposure mask, so that the first mask pattern of the first exposure mask is transferred to the first area of the color material layer. The photolithography is performed by use of the second exposure mask, so that the second mask pattern of the second exposure mask is transferred to the second area of the color material layer that is adjacent to, and partially overlaps, the first area of the color material layer. Namely, according to the method for producing a liquid crystal display apparatus of an embodiment of the present invention, so-called mask joining is performed while the color layer is formed.

The spacers each are located between two same-color sub pixels of a same color that are adjacent to each other in one direction. At least one of the first mask pattern and the second mask pattern includes mask openings in each of which the color layer, included in two sub pixels of a same color that are adjacent to each other interposing each of the spacers therebetween, is to be formed. Namely, a region between the two same-color sub pixels adjacent to the spacer is not a mask joint (is a non-mask joint). Therefore, the spacers are located in regions having a small thickness difference.

In other words, the spacers are not located at positions where the thickness difference is large. Therefore, there is no risk that the thickness difference adversely influences the cell gap via the spacers.

The openings in each of which a color layer, included in two same-color sub pixels of a same color that are adjacent to the spacer, is to be formed each have a size corresponding to two or more of sub pixels of a same color that are adjacent to each other in the one direction. The number of the two or more of sub pixels of a same color that are adjacent to each other in the one direction is the same as a total number of sub pixels of a same color that are included in a plurality of the pixels. Namely, the mask pattern of at least one of the first exposure mask and the second exposure mask is different from the mask pattern of a conventional exposure mask, for the following reason. The size of the openings of the exposure mask (so-called dot size) according to an embodiment of the present invention corresponds to a plurality of pixels, whereas the size of the openings of the conventional exposure mask corresponds to one pixel.

By use of such openings, a color layer corresponding to two same-color sub pixels adjacent to the spacer is formed. Namely, the spacer is located in a central portion, in the one direction, of the color layer. The thickness difference between central portions of the color layers is very small.

By contrast, the mask joints include a portion where two color layers adjacent to each other overlap each other and a portion where two color layers adjacent to each other are unnecessarily separated from each other, due to the positional shift of the first exposure mask and the second exposure mask. In addition, the mask joints have different thicknesses between a portion where the color layer is exposed double and a portion where the color layer is exposed once. For these reasons, the thickness difference between a region between two sub pixels and a region between another two sub pixels is large.

In the case of usual pixels, not the multi-pixels, both of two ends, in one direction, of a color layer on which the spacer is provided are located between sub pixels of a same color included in one and the other of two usual pixels adjacent to each other. In general, a light blocking portion of the light blocking layer or a light blocking member (e.g., a light blocking line) is provided between sub pixels of a same color included in one and the other of two usual pixels adjacent to each other. Therefore, both of the two ends, in the one direction, of the color layer are shielded against light. Thus, there is no risk that the color layer on which the spacer is provided adversely influences the display quality of the liquid crystal display apparatus.

The light blocking layer and the color layer may be included in the same plate-like member. In this case, the color layer closes the opening in the light blocking layer. The spacer may be included in the plate-like member that includes the light blocking layer and the color layer, or may be included in the plate-like member that includes neither the light blocking layer nor the color layer. In the case where the spacer is included in the plate-like member that includes the light blocking layer and the color layer, the spacer may be provided on the light blocking portion of the light blocking layer or on a portion other than the light blocking portion (e.g., on the color layer).

Alternatively, the light blocking layer and the color layer may be included in different plate-like members from each other. In this case, the color layer is located to face the light blocking layer. The spacer may be included in the plate-like member that includes the light blocking layer, or may be included in the plate-like member that does not include the light blocking layer. In the case where the spacer is included in the plate-like member that includes the light blocking layer, the spacer may be provided on the light blocking portion of the light blocking layer or on a portion other than the light blocking portion. In the case where the spacer is included in the plate-like member that includes the color layer, the spacer may be provided on the color layer or on a portion other than the color layer.

Namely, the spacer may be provided at any position in a non-mask joint, not a mask joint, specifically, may be provided on the light blocking portion of the light blocking layer, on the color layer, or on any other portion.

In the case where the spacer is provided in the plate-like member including at least the color layer, the spacer may be formed, for example, at the same time with the color layer or after the formation of the color layer.

The openings and the sub pixels are arranged in a one-by-one structure (in which one sub pixel has one opening) or in a structure in which one opening corresponds to a plurality of sub pixels (i.e., structure in which two or more of sub pixels each have a portion of the one opening).

Among a plurality of sub pixels included in a pixel, at least two sub pixels may have a same color. Alternatively, all the sub pixels included in a pixel may have different colors from each other.

The pixels may each be a multi-pixel or a usual pixel that is not a multi-pixel. The pixels may include the same number of sub pixels or different numbers of sub pixels.

Each of two sub pixels of a same color that are adjacent to each other in one direction may be included in one pixels, or both of the two sub pixels may be included in one pixel. Namely, the spacer may be provided between two pixels adjacent to each other, or may be provided in one pixel.

There is no limitation on the number of spacers. In a pixel including sub pixels adjacent to the spacer, the number of the spacers may be the same as the number of sub pixels included in the pixel (e.g., three spacers for three sub pixels) or may be different from the number of sub pixels included in the pixel (e.g., two or less spacers or four or more spacers for three sub pixels). Pixels including sub pixels adjacent to the spacers may correspond to different number of spacers.

The opening in which the color layer, included in two sub pixel of a same color that are adjacent to the spacer, is to be formed may be included in one of the first exposure mask and the second exposure mask, or may be included in each of the first exposure mask and the second exposure mask.

The shape and the size of the openings may be the same or different as long as the spacer is provided in a non-mask joint.

According to an embodiment of the present invention, the number of two or more of sub pixels of a same color that are adjacent to each other in the one direction is two times or more of a total number of sub pixels of a same color included in each of the plurality of the pixels. The pixels may each be a multi-pixel.

In this case, the opening in which the color layer, included in two sub pixels of a same color that are adjacent to the spacer, is to be formed has a size corresponding to $\{2 \times K\}$ sub pixels (K is a natural number) included in K multi-pixels and one sub pixel included in each of two multi-pixels.

As a result, both of two ends, in one direction, of a color layer on which the spacer is provided are located between sub pixels of a same color included in one and the other of two multi-pixels. In general, a light blocking portion of the light blocking layer or a light blocking member is provided between sub pixels of a same color included a multi-pixel. Therefore, both of the two ends, in the one direction, of the color layer are shielded against light. Thus, there is no risk that the color layer on which the spacer is provided adversely influences the display quality of the liquid crystal display apparatus.

According to the method for producing a liquid crystal display apparatus of an embodiment of the present invention, the spacers are located in regions having merely a small thickness difference. Therefore, the cell gap of the liquid crystal display apparatus is not influenced by a large thickness difference. Thus, the cell gap is made uniform. This improves the display quality of the liquid crystal display apparatus.

The exposure mask according to an embodiment of the present invention is preferable for producing a liquid crystal display apparatus by the method for producing a liquid crystal display apparatus of an embodiment of the present invention.

BRIEF DESCRIPTION OF THE DRAWINGS

FIG. 29 provides cross-sectional views showing the method for producing the liquid crystal display apparatus in embodiment 5 according to the present invention.

DETAILED DESCRIPTION OF PREFERRED EMBODIMENTS

Figure 1:
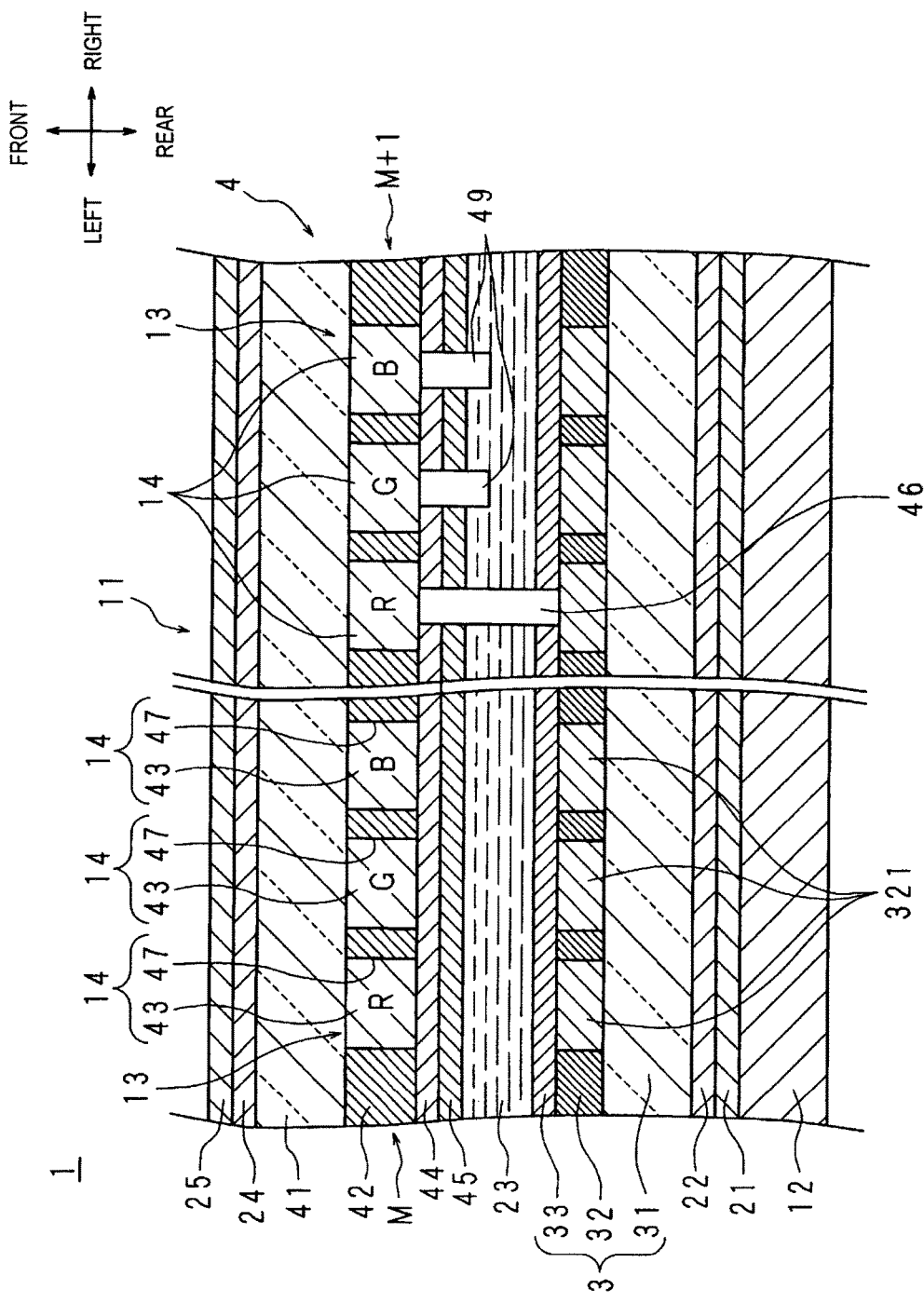
FIG. 1 is a cross-sectional view schematically showing a structure of a liquid crystal display apparatus produced by a method for producing a liquid crystal display apparatus in embodiment 1 according to the present invention.

Hereinafter, embodiments of the present invention will be described in detail with reference to the drawings showing embodiments thereof. The following description will be made with the directions "up", "down", "front", "rear", "left" and "right" shown in the drawings.

Embodiment 1

Figure 2:
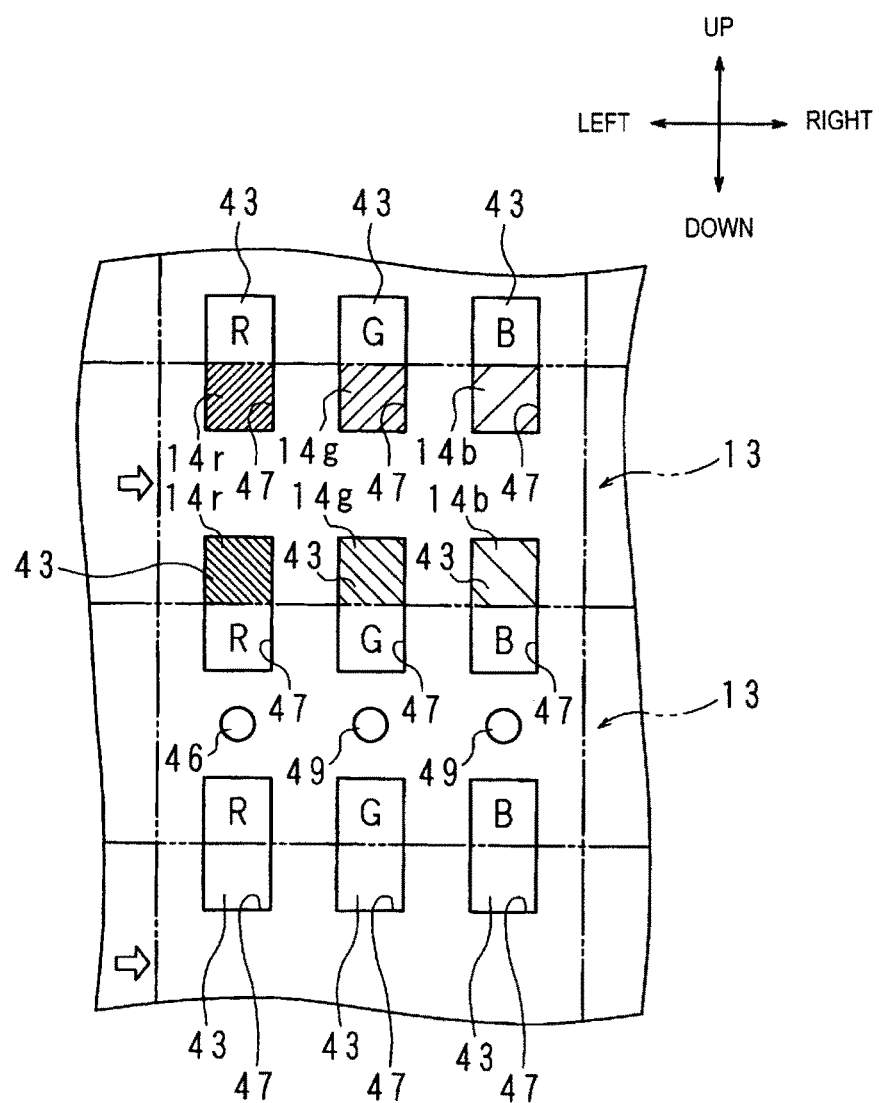
FIG. 2 is a front view schematically showing the structure of the liquid crystal display apparatus.

FIG. 1 and FIG. 2 are respectively a cross-sectional view and a front view schematically showing a structure of a liquid crystal display apparatus 1 produced by a method for producing a liquid crystal display apparatus in embodiment 1 according to the present invention. FIG. 2 omits a polarizer plate 24, a protection glass 25 and a light-transmissive plate 41 described below.

Figure 3:
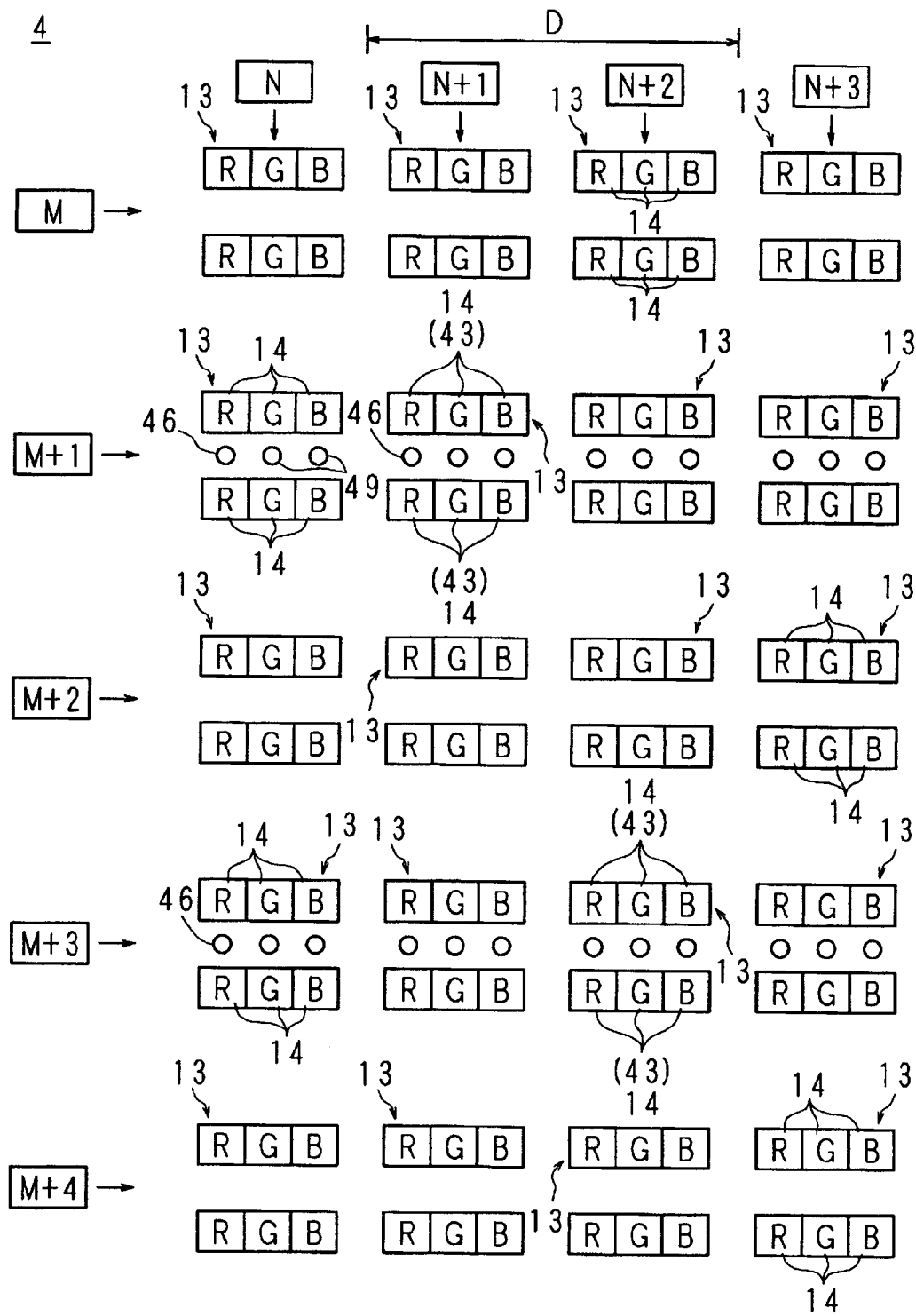
FIG. 3 is a front view schematically showing a structure of a counter substrate included in the liquid crystal display apparatus.

FIG. 3 is a front view schematically showing a structure of a counter substrate 4 included in the liquid crystal display apparatus 1. The upward, downward, leftward and rightward directions of the counter substrate 4 shown in FIG. 3 are the upward, downward, leftward and rightward directions for a person facing FIG. 3.

The liquid crystal display apparatus 1 is provided as a TV receiver, a display or the like. The liquid crystal display apparatus 1 displays a color image with the RGB three primary colors. Hereinafter, elements having red (R), green (G) and blue (B) colors are distinguished from each other with "r", "g" and "b" attached to the reference signs thereof.

The liquid crystal display apparatus 1 includes a liquid crystal panel 11 forming a front portion of the liquid crystal display apparatus 1, and an illumination device 12 forming a rear portion of the liquid crystal display apparatus 1. The liquid crystal panel 11 includes a diffuser plate 21, a polarizer plate 22, a TFT substrate 3 (plate-like member), a liquid crystal layer 23 formed of a liquid crystal material, the counter substrate 4 (plate-like member), the polarizer plate 24, and the protection glass 25, which are provided forward to the illumination device 12. These elements are provided sequentially in this order from a rear position to a front position. The TFT substrate 3 includes a light-transmissive plate 31, a TFT layer 32, and an alignment film 33. The counter substrate 4 includes the light-transmissive plate 41, a BM 42, color layers 43, a transparent electrode portion 44, an alignment film 45, spacers 46, and spacers 49.

The liquid crystal panel 11 includes a rectangular display region and a rectangular frame-shaped region (not shown) enclosing the display region. The display region of the liquid crystal panel 11 includes a plurality of multi-pixels 13 arrayed in the up-down direction and the left-right direction. Hereinafter, a line of the multi-pixels 13 arrayed in the left-right direction will be referred to as a "row", and a line of the multi-pixels 13 arrayed in the up-down direction will be referred to as a "column". In this specification, the term "rectangular" encompasses "square".

In FIG. 1, a region including a multi-pixel 13 in an even-numbered row of the liquid crystal display apparatus 1 is shown in a left part, and a region including a multi-pixel 13 in an odd-numbered row of the liquid crystal display apparatus 1 is shown in a right part. Referring to FIG. 2, among two rectangular regions enclosed by the two-dot chain lines, the upper rectangular region corresponds to the multi-pixel 13 in an even-numbered row, and the lower rectangular region corresponds to the multi-pixel 13 in an odd-numbered row. FIG. 3 shows the multi-pixels 13 in the Mth through {M+4}th rows and the Nth through {N+3}th columns. M and N are each an even number satisfying M, N≥0.

The multi-pixels 13 each include sub pixels 14 for three primary colors of RGB (two sub pixels for each color; six sub pixels in total). In FIG. 2, the hatched portions with lines inclining upward and rightward are respectively upper sub pixels 14$r$, 14$g$ and 14$b$ of the multi-pixel 13 in the even-numbered row, and the hatched portions with lines inclining downward and rightward are respectively lower sub pixels 14$r$, 14$g$ and 14$b$ of the multi-pixel 13 in the even-numbered row.

The two sub pixels 14 of a same color included in each multi-pixel 13 (namely, two same-color sub pixels 14) are arrayed in the up-down direction. Sets of such two same-color sub pixels 14 of different colors are arrayed from left to right in the order of the red sub pixels, the green sub pixels and the blue sub pixels. In the entirety of the counter substrate 4, the sub pixels 14 for the RGB three primary colors are located such that the sub pixels 14 of a same color are arrayed in the up-down direction in a striped pattern.

As shown in FIG. 2, two multi-pixels 13 adjacent to each other in the up-down direction are in contact with each other, and the distance between these two multi-pixels 13 is considered to be "0". Namely, the distance between two same-color sub pixels 14 is longer than the distance between two multi-pixels 13 adjacent to each other in the up-down direction.

It should be noted that in FIG. 3, in order to allow multi-pixels 13 to be distinguished clearly from each other, two multi-pixels 13 adjacent to each other in the up-down direction are shown as being separated from each other, and the distance between two multi-pixels 13 adjacent to each other in the up-down direction is shown as being longer than the distance between two same-color sub pixels 14.

The diffuser plate 21 and the polarizer plate 22 included in the liquid crystal panel 11 are light-transmissive and are rectangular. The diffuser plate 21 forms a rearmost portion of the liquid crystal panel 11. The polarizer plate 22 is stacked on a front surface of the diffuser plate 21.

The light-transmissive plate 31 included in the TFT substrate 3 is formed of a rectangular glass plate. The light-transmissive plate 31 is stacked on a front surface of the polarizer plate 22.

The TFT layer 32 is stacked on a front surface of the light-transmissive plate 31. The TFT layer 32 includes a plurality of light-transmissive pixel electrodes 321, light blocking TFTs (not shown) provided in the same number as that of the pixel electrodes 321, and a plurality of gate bus lines and a plurality of Cs bus lines extending in the left-right direction (neither the gate bus lines nor the Cs bus lines are shown). The sub pixels 14 each include one pixel electrode 321 and one TFT, which are electrically connected with each other.

The alignment film 33 is light-transmissive and is stacked in the display region, more specifically, on a front surface of the TFT layer 32.

The light-transmissive plate 41 included in the counter substrate 4 is formed of a rectangular glass plate.

The BM 42 is a black matrix, and acts as a light blocking layer in embodiment 1 according to the present invention. The BM 42 is stacked on a rear surface of the light-transmissive plate 41.

The BM 42 includes a plurality of rectangular openings 47 in the display region. More specifically, a plurality of openings 47 are arrayed both in the up-down direction and in the left-right direction. The openings 47 are separated from each other. Namely, light blocking portions of the BM 42 are located between every two openings 47 adjacent to each other.

In embodiment 1, a peripheral region of each of the openings 47 is the light blocking portion of the BM 42. The openings 47 are not limited to having such a structure. A part of the peripheral region of an opening 47 that is not adjacent to another opening 47 may be non-light blocking. Namely, a part of the peripheral region of an opening 47 may positionally match a part of a peripheral region of the light-transmissive plate 41.

The color layers 43 are light-transmissive, and each have one of the RGB three primary colors. One color layer 43 closes one opening 47. The color layers 43 are each formed on the peripheral region, and inside, of the opening 47 in order to close the opening 47 with certainty.

The transparent electrode portion 44 is stacked on a rear surface of the BM 42 and the color layers 43 in the display region.

The alignment film 45 is light-transmissive and is stacked on a rear surface of the transparent electrode portion 44. The alignment films 33 and 45 are provided to align liquid crystal molecules contained in the liquid crystal layer 23 in a certain direction.

The sub pixels 14 each include the opening 47 of the BM 42, and the color layer 43, and the pixel electrode 321 and the TFT included in the TFT layer 32. It should be noted that the opening 47 of each sub pixel 14 is an upper half or a lower half of one opening 47. Therefore, a front surface of the TFT substrate 3 (more specifically, front surface of the alignment film 33) and a rear surface of the counter substrate 4 (more specifically, rear surface of the alignment film 45) are located to face each other such that each pixel electrode 321 faces the upper half or the lower half of the opening 47.

The light blocking portion of the BM 42 is not provided between two multi-pixels 13 adjacent to each other in the up-down direction. Therefore, as compared with the case where the light blocking portion of the BM 42 is provided between two multi-pixels 13 adjacent to each other in the up-down direction, the resolution of the liquid crystal display apparatus 1 is improved. Alternatively, the light blocking portion of the BM 42 may be provided between two multi-pixels 13 adjacent to each other in the up-down direction.

The transparent electrode portion 44 acts as a common electrode facing the pixel electrodes 321 of the TFT layer 32.

The TFTs included in the TFT layer 32 respectively face the light blocking portions included in the BM 42. The gate bus lines included in the TFT layer 32 each face the light blocking portion between two same-color sub pixels 14 included in the BM 42. The Cs bus lines included in the TFT layer 32 each face a border between the multi-pixels 13.

The TFT substrate 3 and the counter substrate 4 facing each other are bonded together with a sealing portion (not shown). The sealing portion is light-transmissive and is rectangular frame-shaped. The sealing portion is provided between the TFT substrate 3 and the counter substrate 4 and is bonded to frame-shaped regions of the TFT substrate 3 and the counter substrate 4. The provision of the sealing portion between the TFT substrate 3 and the counter substrate 4 allows the TFT substrate 3 and the counter substrate 4 to face each other with an appropriate cell gap.

The spacers 46 and 49 are column-like members extending in the front-rear direction. The spacers 49 each have a length about half of that of each spacer 46.

The spacers 46 are each located between two same-color sub pixels 14*r*. The spacer 46 contains the same material as that of the color layer 43*g* and 43*b*.

The spacers 49 are each located either between two same-color sub pixels 14*g* or between two same-color sub pixels 14*b*. The spacer 49 located between two same-color sub pixel 14*g* contains the same material as that of the color layer 43*b*. The spacer 49 located between two same-color sub pixel 14*b* contains the same material as that of the color layer 43*g*.

The spacer 46 is a so-called main spacer, and is provided between the TFT substrate 3 and the counter substrate 4 to uniformize the cell gap.

The spacers 49 are so-called sub spacers, and when an external force is applied in a direction of shortening the cell gap, suppress the cell gap from being excessively shortened. As a result, the liquid crystal display apparatus 1 is suppressed from being excessively deformed and broken when an external force is applied in a direction of shortening the cell gap.

In some conventional liquid crystal display apparatuses, the spacer 46 and the spacers 49 are provided in all the multi-pixels.

By contrast, in the liquid crystal display apparatus 1, the spacer 46 and the spacers 49 are provided in a part of the multi-pixels 13, but are not provided in the remaining multi-pixels 13. Specifically, the spacer 46 and the spacers 49 are provided in the multi-pixels 13 in the odd-numbered rows ({M+1}th row, {M+3}th row, etc.) but are not provided in the multi-pixels 13 in the even-numbered rows (Mth row, {M+2}th row, {M+4}th row, etc.).

The liquid crystal layer 23 included in the liquid crystal panel 11 is light-transmissive. The liquid crystal layer 23 is contained in a space that is between the TFT substrate 3 and the counter substrate 4 and is enclosed by the sealing portion. The spacer 46 and the spacers 49 extend through the liquid crystal layer 23.

The polarizer plate 24 and the protection glass 25 are light-transmissive, and are rectangular.

The polarizer plate 24 is stacked on a front surface of the light-transmissive plate 41. The polarizer plates 22 and 24 respectively transmit linearly polarized light components perpendicular to each other.

The protection glass 25 is stacked on a front surface of the polarizer plate 24.

The illumination device 12 is a direct light type or edge light type backlight unit. The illumination device 12 illuminates the liquid crystal panel 11 from the rear thereof.

Light emitted by the illumination device 12 is transmitted through the diffuser plate 21 to be diffused. The diffused light is transmitted through the polarizer plate 22 and is incident on the TFT substrate 3.

The light incident on the TFT substrate 3 is transmitted through the light-transmissive plate 31, the pixel electrodes 321 included in the TFT layer 32, and the alignment film 33 sequentially and is incident on the liquid crystal layer 23.

In the case where no voltage is applied between each of the pixel electrodes 321 included in the TFT layer 32 and the transparent electrode portion 44, the light incident on the liquid crystal layer 23 located to the front of the pixel electrodes 321 is transmitted through the liquid crystal layer 23 with no change.

By contrast, in the case where a voltage is applied between each of the pixel electrodes 321 included in the TFT layer 32 and the transparent electrode portion 44, the light incident on the liquid crystal layer 23 located to the front of the pixel electrodes 321 is transmitted through the liquid crystal layer 23 after being polarized by the liquid crystal layer 23. A reason for this is that the application of the voltage changes the alignment state of the liquid crystal molecules contained in the liquid crystal layer 23.

The light transmitted through the liquid crystal layer 23 is incident on the counter substrate 4.

The light incident on the counter substrate 4 is transmitted through the alignment film 45, the transparent electrode portion 44, the color layers 43, and the light-transmissive plate 41 sequentially, and is output from the counter substrate 4.

In the case where the light is transmitted through the liquid crystal layer 23 with no change, the light, after being output from the counter substrate 4, is blocked by the polarizer plate 24. In the case where the light is polarized by the liquid crystal layer 23, the light, after being output from the counter substrate 4, is transmitted through the polarizer plate 24 and the protection glass 25 sequentially and is output outside.

As a result, a color image is displayed in the display region of the liquid crystal panel 11.

Figure 4:
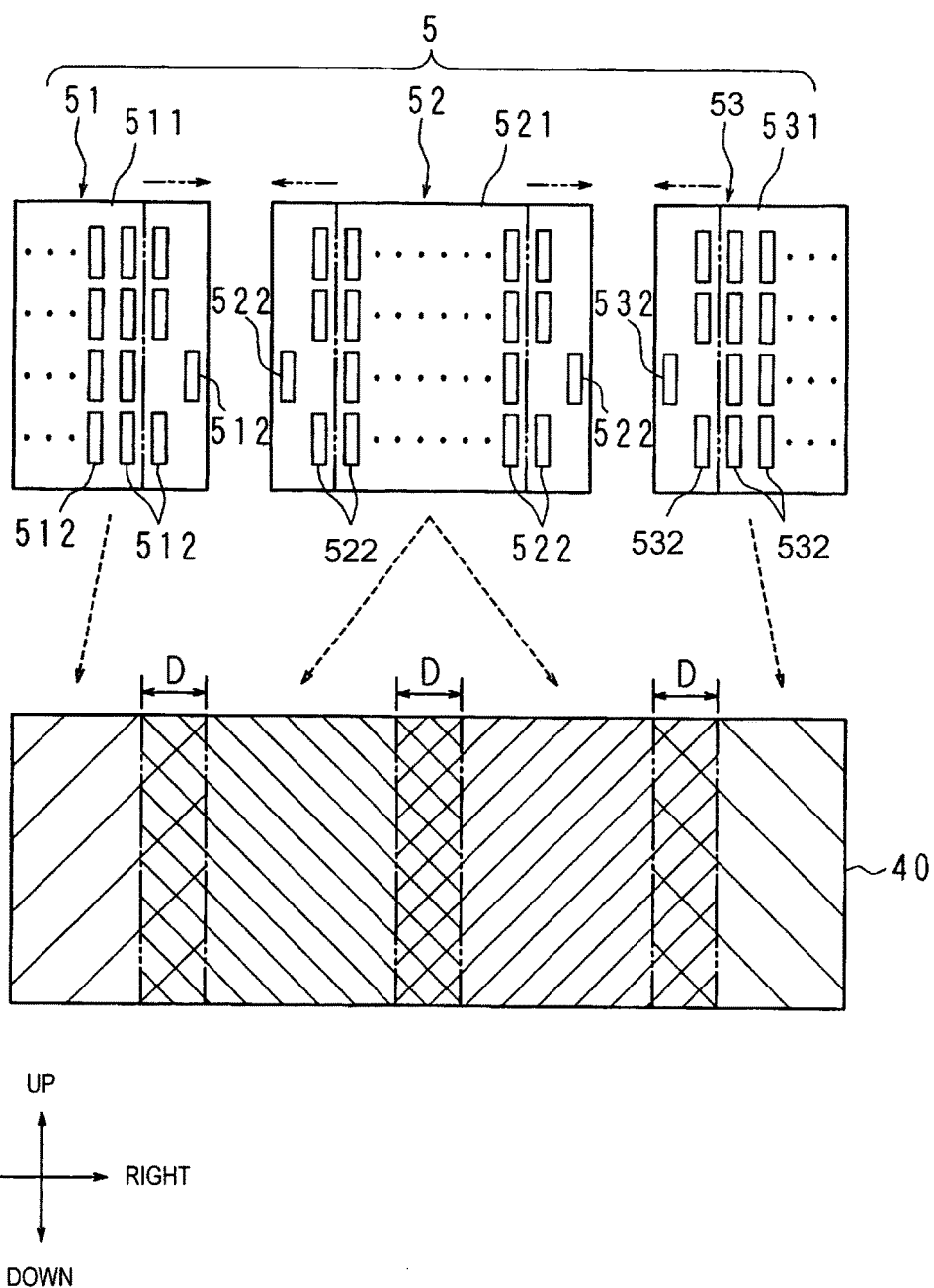
FIG. 4 is a front view showing the method for producing the liquid crystal display apparatus.

FIG. 4 is a front view showing a method for producing the liquid crystal display apparatus 1. Specifically, FIG. 4 shows a method for producing the counter substrate 4. An upper part of FIG. 4 schematically shows an exposure mask 5, and a lower part of FIG. 4 schematically shows a color material layer 40.

The color material layer 40 is provided to form the color layers 43 each having one of the RGB three primary colors. The color material layer 40 may be formed of a photoresist or may have a photoresist famed on a surface thereof.

The exposure mask 5 includes a left mask portion 51, a central mask portion 52 and a right mask portion 53.

The left mask portion 51, the central mask portion 52 and the right mask portion 53 respectively have mask patterns 511, 521 and 531, each of which corresponds to the color layer 43 having one of the RGB three primary colors.

An exposure mask 5*r* for red, an exposure mask 5*g* for green and an exposure mask 5*b* for blue have similar structures to each other.

It should be noted that the mask patterns 511, 521 and 531 of the exposure mask 5*r* do not include openings in which the spacer 46 and the spacers 49 are to be formed.

By contrast, the mask patterns 511, 521 and 531 of the exposure mask 5*g* include an opening in which the spacer 46 is to be formed, and also include openings in which the spacers 49 are to be formed between two same-color sub pixels 14*b*. The mask patterns 511, 521 and 531 of the exposure mask 5*b* include an opening in which the spacer 46 is to be formed, and also include openings in which the spacers 49 are to be formed between two same-color sub pixels 14*g*.

Hereinafter, the exposure mask 5r for red will be mainly described.

The mask pattern 511 of the left mask portion 51 includes openings 512, in which the color layers 43 are to be formed. The openings 512 are separated from each other by an appropriate distance in the up-down direction and the left-right direction.

Similarly, the mask pattern 521 of the central mask portion 52 includes openings 522. The mask pattern 531 of the right mask portion 53 includes openings 532.

The mask patterns 511, 521 and 531 are transferred to the color material layer 40 by photolithography performed by use of the exposure mask 5.

Regarding the mask pattern 511 of the left mask portion 51, in a left portion and a central portion in the left-right direction, the openings 512, in which the color layers 43 are to be formed, are arrayed in a matrix at a constant density.

A right portion of the mask pattern 511 is a coarse-dense portion, where the density of the openings 512, which are arrayed in a matrix in the left portion and the central portion, is changed. More specifically, the density of the openings 512 is gradually changed from high in a portion close to the central portion to low in a right end portion. In FIG. 4, the arrows represented by the two-dot chain lines show the directions in which the density of the openings 512 is changed from high to low.

The mask pattern 511 of the left mask portion 51 is transferred to a predetermined area of a left portion of the color material layer 40 (area represented with the coarse hatching inclining upward and rightward).

Regarding the mask pattern 521 of the central mask portion 52, in a central portion in the left-right direction, the openings 522, in which the color layers 43 are to be formed, are arrayed in a matrix at a constant density.

A left portion of the mask pattern 521 is a coarse-dense portion. The density of the openings 522 is gradually changed from high in a portion close to the central portion to low in a left end portion. The coarse-dense pattern of the openings 522 of the left portion of the mask pattern 521, and the coarse-dense pattern of the openings 512 of the right portion of the mask pattern 511 of the left mask portion 51, complement each other.

A right portion of the mask pattern 521 is a coarse-dense portion. The density of the openings 522 is gradually changed from high in a portion close to the central portion to low in a right end portion. The coarse-dense pattern of the openings 522 of the right portion of the mask pattern 521, and the coarse-dense pattern of the openings 522 of the left portion of the mask pattern 521, complement each other.

The mask pattern 521 of the central mask portion 52 is transferred to a predetermined area of a central portion in the left-right direction of the color material layer 40.

In more detail, the mask pattern 521 of the central mask portion 52 is transferred to a predetermined area to the right of, and partially overlapping, the area to which the mask pattern 511 of the left mask portion 51 is transferred (area represented with the coarse hatching inclining upward and rightward; first area). The area to which the mask pattern 521 of the central mask portion 52 is transferred is represented with fine hatching inclining downward and rightward (second area). The mask pattern 521 of the central mask portion 52 is also transferred to another predetermined area to the right of, and partially overlapping, the area to which the mask pattern 521 of the central mask portion 52 is previously transferred (area represented with the fine hatching inclining downward and rightward; first area). The other predetermined area is represented with fine hatching inclining upward and rightward (second area).

Regarding the mask pattern 531 of the right mask portion 53, in a right portion and a central portion in the left-right direction, the openings 532, in which the color layers 43 are to be formed, are arrayed in a matrix at a constant density.

A left portion of the mask pattern 531 is a coarse-dense portion. The density of the openings 532 is gradually changed from high in a portion close to the central portion to low in a left end portion. The coarse-dense pattern of the openings 532 of the left portion of the mask pattern 531, and the coarse-dense pattern of the openings 522 of the right portion of the mask pattern 521 of the central mask portion 52, complement each other.

The mask pattern 531 of the right mask portion 53 is transferred to a predetermined area of a right portion of the color material layer 40.

In more detail, the mask pattern 531 of the right mask portion 53 is transferred to a predetermined area to the right of, and partially overlapping, the area to which the mask pattern 521 of the central mask portion 52 is transferred immediately previously (area represented with the fine hatching inclining upward and rightward; first area). The area to which the mask pattern 531 of the right mask portion 53 is transferred is represented with coarse hatching inclining downward and rightward (second area).

Hereinafter, the areas in which the mask patterns are transferred in an overlapping manner will be referred to as "double exposure areas D". FIG. 4 shows one double exposure area D where the patterns of the left mask portion 51 and the central mask portion 52 are transferred in an overlapping manner, one double exposure area D where the pattern of the central mask portion 52 is transferred in an overlapping manner, and one double exposure area D where the patterns of the central mask portion 52 and the right mask portion 53 are transferred in an overlapping manner.

In embodiment 1, each double exposure area D includes the multi-pixels 13 for two columns (see FIG. 3).

Figure 5:
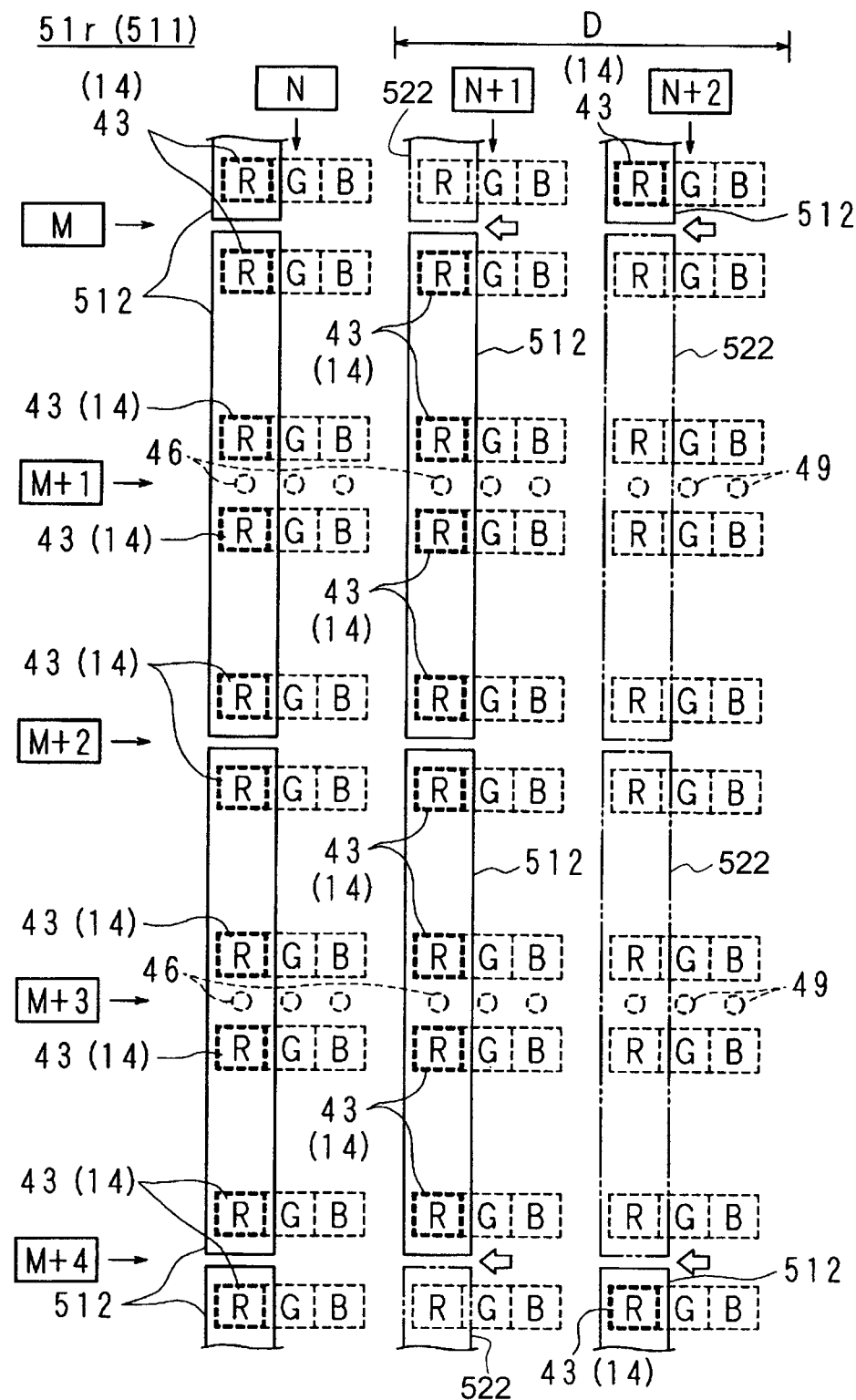
FIG. 5 is a front view schematically showing a structure of a first exposure mask for red in embodiment 1 according to the present invention.
Figure 6:
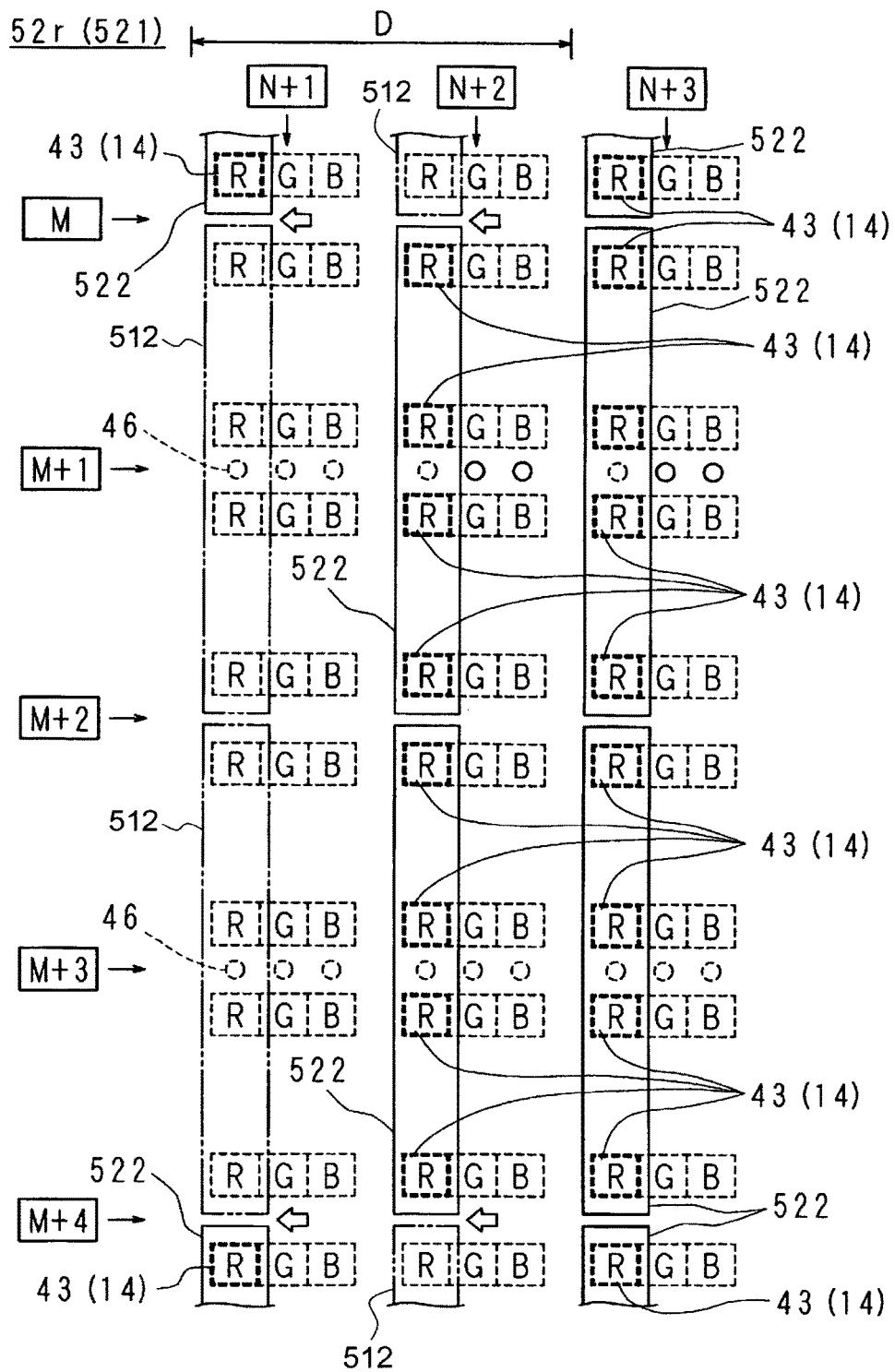
FIG. 6 is a front view schematically showing a structure of a second exposure mask for red in embodiment 1 according to the present invention.

FIG. 5 and FIG. 6 are front views schematically showing structures of a first exposure mask and a second exposure mask for red in embodiment 1 according to the present invention. FIG. 5 shows a left mask portion 51r, and FIG. 6 shows a central mask portion 52r. The upward, downward, leftward and rightward directions of the left mask portion 51r and the central mask portion 52r shown in FIG. 5 and FIG. 6 are the upward, downward, leftward and rightward directions for a person facing FIG. 5 and FIG. 6.

In the case where the left mask portion 51r acts as the first exposure mask in embodiment 1 according to the present invention, a right mask portion 53r acts as the second exposure mask in embodiment 1 according to the present invention. The central mask portion 52r acts as the second exposure mask in relation with the left mask portion 51r, and acts as the first exposure mask in relation with the right mask portion 53r. The central mask portion 52r acts as the first exposure mask or the second exposure mask in relation with the central mask portion 52r.

FIG. 5 shows the left mask portion 51r acting as the first exposure mask for red.

In FIG. 5, the openings 512 included in the mask pattern 511 of the left mask portion 51r are shown with the solid lines. The openings 522 included in the mask pattern 521 of the central mask portion 52r are shown with the two-dot chain lines.

In FIG. 5, the sub pixels 14 including the color layers 43, which are to be formed in the openings 512, are shown with the thick dashed lines. The other sub pixels 14, the spacers 46 and the spacers 49 are shown with the thin dashed lines.

Similarly, FIG. 6 shows the central mask portion 52*r* acting as the second exposure mask for red.

In FIG. 6, the openings 522 included in the mask pattern 521 of the central mask portion 52*r* are shown with the solid lines. The openings 512 included in the mask pattern 511 of the left mask portion 51*r* are shown with the two-dot chain lines.

In FIG. 6, the sub pixels 14 including the color layers 43, which are to be formed in the openings 522, are shown with the thick dashed lines. The other sub pixels 14, the spacers 46 and the spacers 49 are shown with the thin dashed lines.

In FIG. 5 and FIG. 6, the locations of the sub pixels 14, the spacers 46, and the spacers 49 correspond to the locations thereof in FIG. 3.

In the mask pattern 511 of the left mask portion 51*r*, the {N+1}th columns through the {N+2}th column correspond to the coarse-dense portion in the right portion of the left mask portion 51*r*. The density of the openings 512 in the {N+1}th column is higher than the density of the openings 512 in the {N+2}th column.

In the mask pattern 521 of the central mask portion 52*r*, the {N+1}th column through the {N+2}th column correspond to the coarse-dense portion in the left portion of the central mask portion 52*r*. The density of the openings 522 in the {N+2}th column is higher than the density of the openings 522 in the {N+1}th row.

In the case where the left mask portion 51*r* and the central mask portion 52*r* overlap each other virtually, the openings 512 and the openings 522 are located in a matrix.

In the mask pattern 511 of the left mask portion 51*r* shown in FIG. 5, the openings 512 each have a size corresponding to four sub pixels 14*r* adjacent to each other in the up-down direction. The number of the sub pixels, namely, four, is the same as the number of the sub pixels 14*r* included in two multi-pixels 13.

Similarly, in the mask pattern 521 of the central mask portion 52*r* shown in FIG. 6, the openings 522 each have a size corresponding to four sub pixels 14*r* adjacent to each other in the up-down direction and the left-right direction.

The four sub pixels 14*r* corresponding to each opening 512 or 522 are two same-color sub pixels 14*r* included in a multi-pixel 13 in an odd-numbered row, the lower sub pixel 14*r* included in the multi-pixel 13 in an even-numbered row upper to, and adjacent to, the multi-pixel 13 in the odd-numbered row, and the upper sub pixel 14*r* included in the multi-pixel 13 in an even-numbered row lower to, and adjacent to, the multi-pixel 13 in the odd-numbered row.

Namely, the mask patterns 511 and 521 include the openings 512 and 522, in each of which one color layer 43*r* corresponding to two same-color sub pixels 14*r* adjacent to the spacer 46 is to be formed.

In other words, a region between two same-color sub pixels 14*r* adjacent to the spacer 46 is a non-mask joint.

FIG. 5 and FIG. 6 show mask joints with white arrows. Such a mask joint is not located between two same-color sub pixels 14*r* included in each multi-pixel 13 in each odd-numbered row but is located between two same-color sub pixels 14*r* included in each multi-pixel 13 in each even-numbered row.

The mask patterns 511 and 521 of the coarse-dense portions of the exposure mask 5 are designed as follows. Four sub pixels 14*r* adjacent to each other in the up-down direction including two same-color sub pixels 14*r* in a multi-pixel 13 in an odd-numbered row (namely, the sub pixels 14*r* for two multi-pixels 13) are set as one unit. An opening is set for each unit. Then, it is determined whether the set opening is to be formed in the left mask portion 51*r* or the central mask portion 52*r*.

In the case where, for example, two openings 512 (or 522) are adjacent to each other in the up-down direction, such two openings 512 (or 522) may be set as one opening (opening corresponding to sub pixels for four multi-pixels 13).

Figure 7:
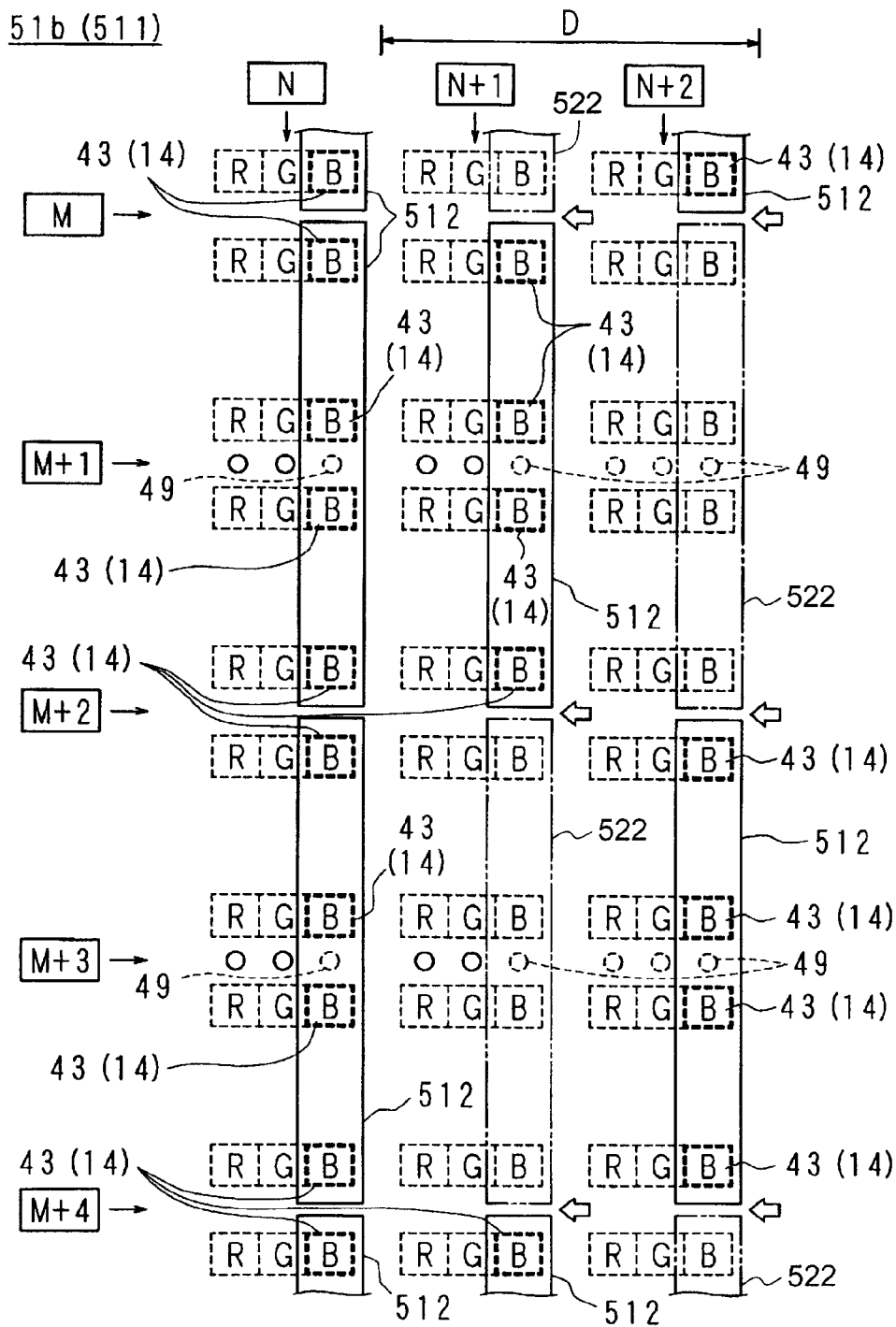
FIG. 7 is a front view schematically showing a structure of a first exposure mask for blue in embodiment 1 according to the present invention.
Figure 8:
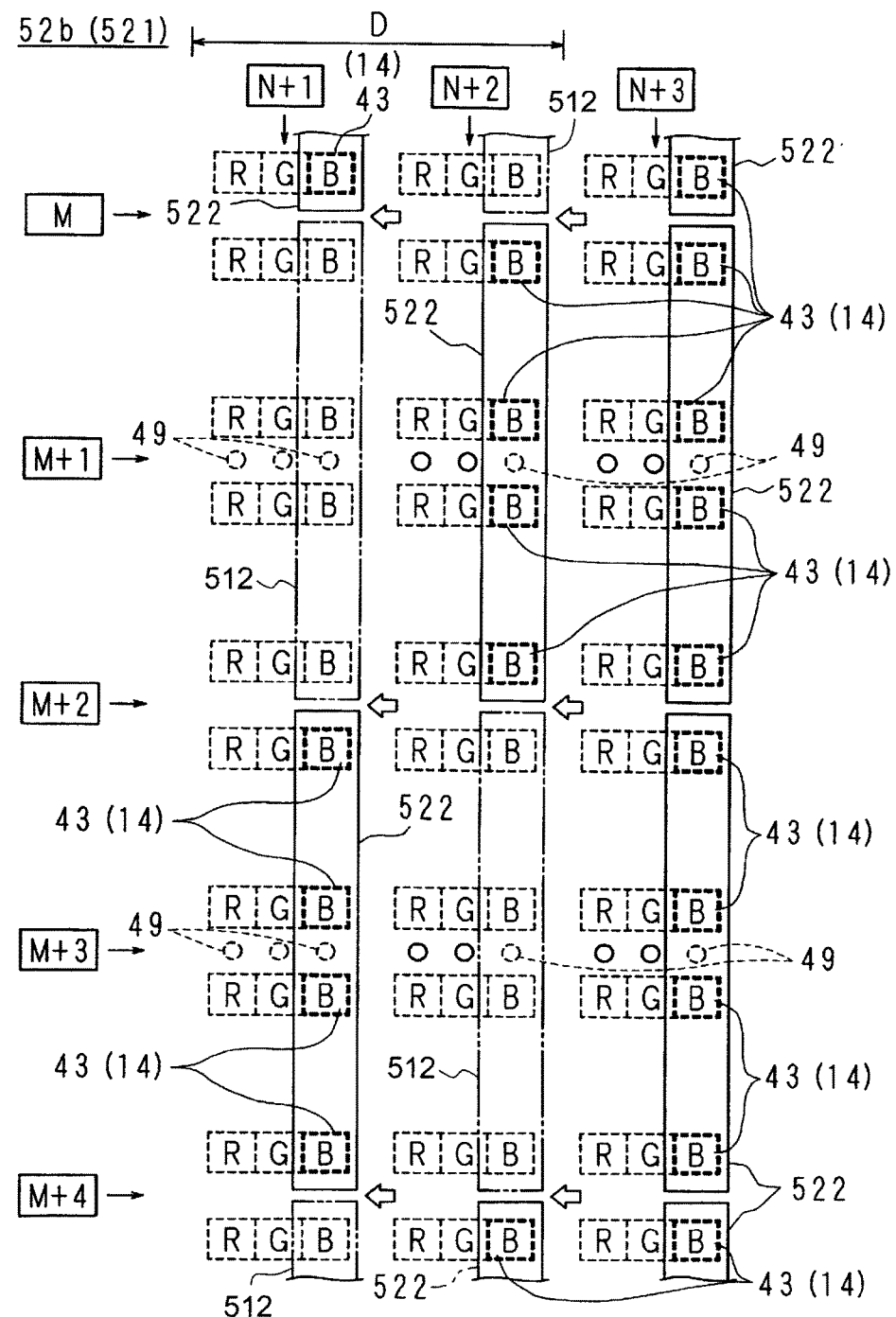
FIG. 8 is a front view schematically showing a structure of a second exposure mask for blue in embodiment 1 according to the present invention.

FIG. 7 and FIG. 8 are front views schematically showing structures of a first exposure mask and a second exposure mask for blue. FIG. 7 and FIG. 8 respectively correspond to FIG. 5 and FIG. 6.

FIG. 7 shows a left mask portion 51*b* acting as the first exposure mask for blue, and FIG. 8 shows a central mask portion 52*b* acting as the second exposure mask for blue.

The openings 512 included in the mask pattern 511 of the left mask portion 51*b* is substantially the same as the openings 512 included in the mask pattern 511 of the left mask portion 51*r*, but is different therefrom in the coarse-dense distribution.

Similarly, the openings 522 included in the mask pattern 521 of the central mask portion 52*b* is substantially the same as the openings 522 included in the mask pattern 521 of the central mask portion 52*r*, but is different therefrom in the coarse-dense distribution.

The mask patterns 511 and 521 of the left mask portion 51*b* and the central mask pattern 52*b* include the openings 512 and 522, in each of which one color layer 43*b* corresponding to two same-color sub pixels 14*b* adjacent to the spacer 49 is to be formed.

Figure 9:
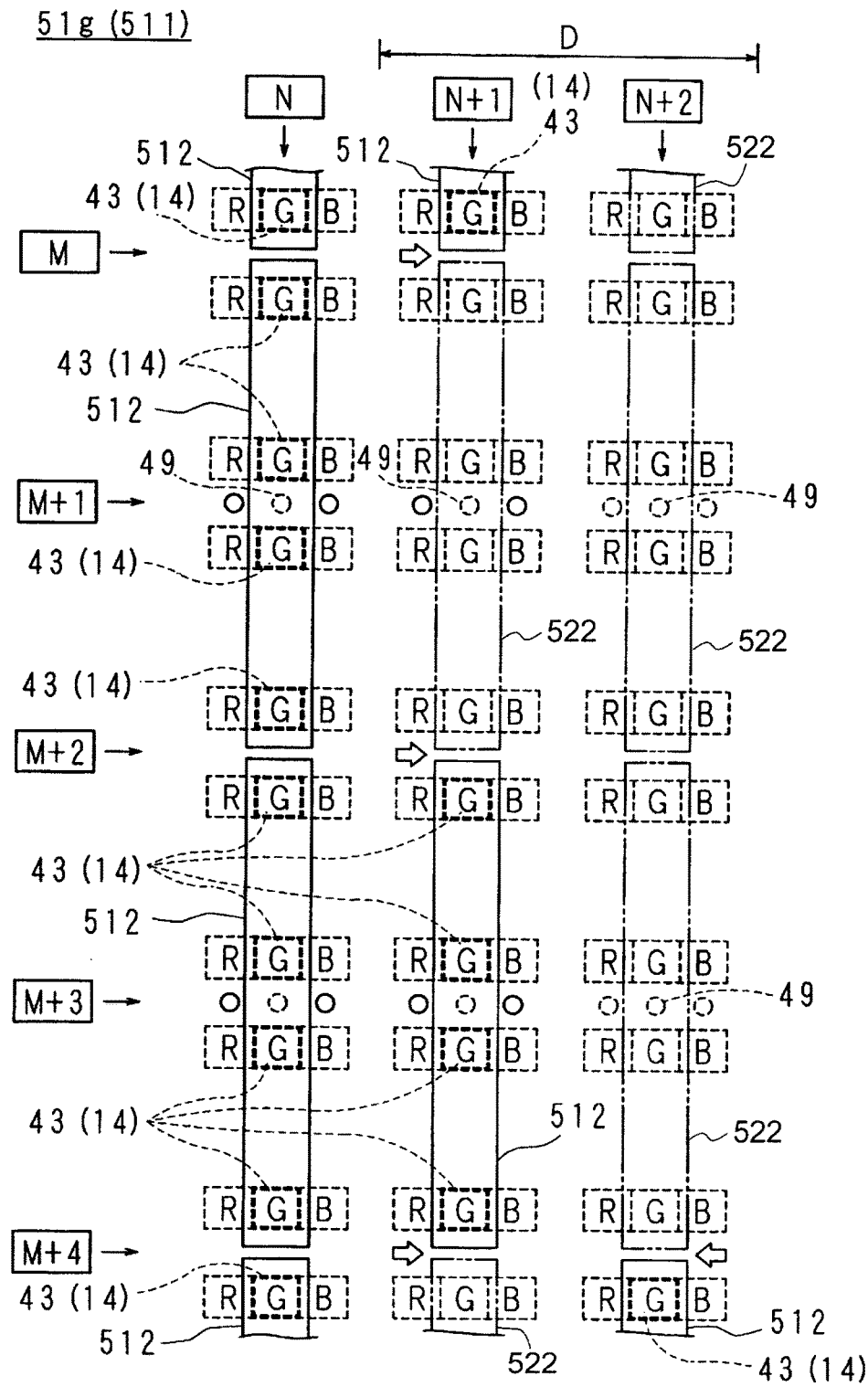
FIG. 9 is a front view schematically showing a structure of a first exposure mask for green in embodiment 1 according to the present invention.
Figure 10:
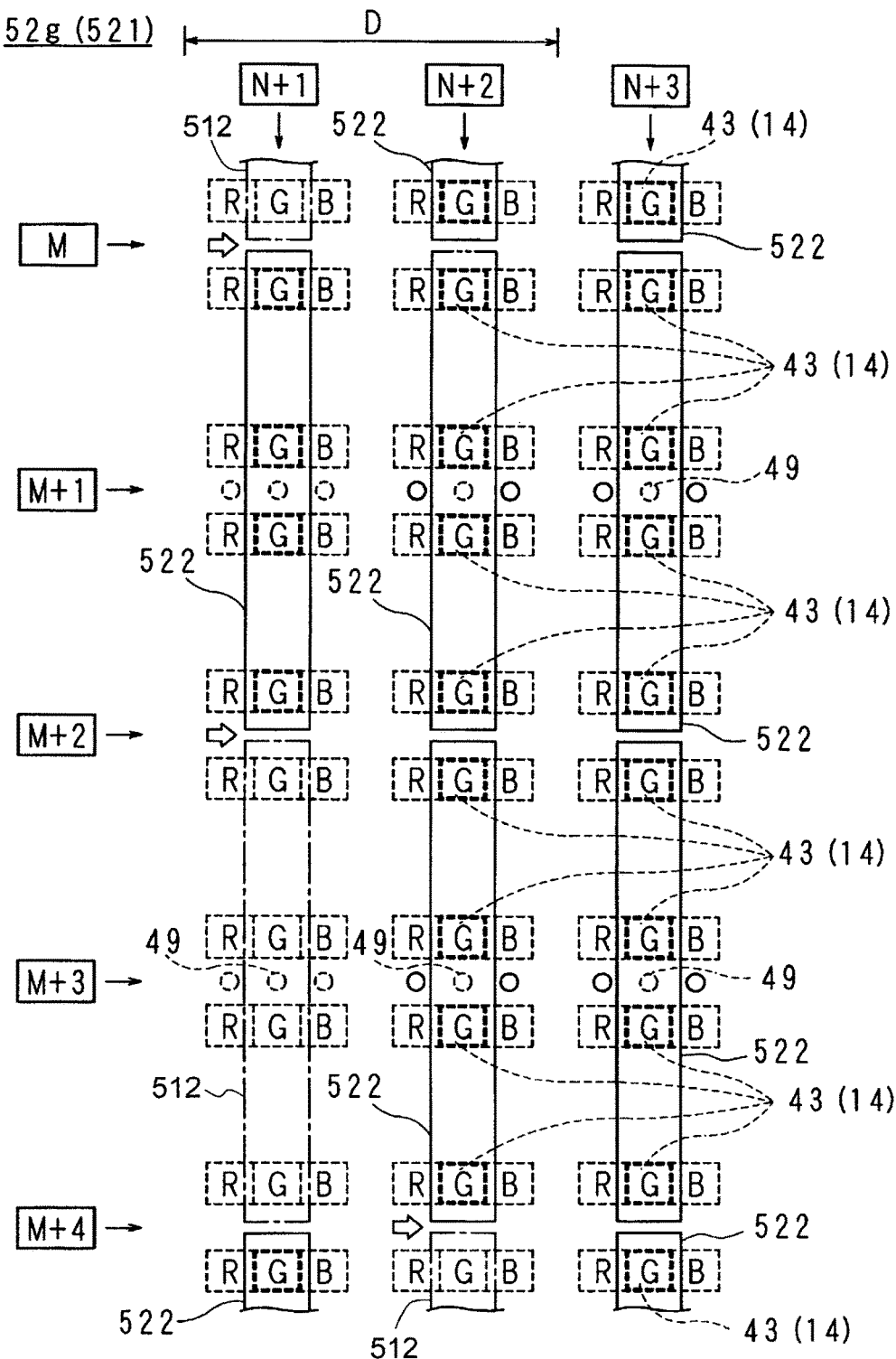
FIG. 10 is a front view schematically showing a structure of a second exposure mask for green in embodiment 1 according to the present invention.

FIG. 9 and FIG. 10 are front views schematically showing structures of a first exposure mask and a second exposure mask for green. FIG. 9 and FIG. 10 respectively correspond to FIG. 5 and FIG. 6.

FIG. 9 shows a left mask portion 51*g* acting as the first exposure mask for green, and FIG. 10 shows a central mask portion 52*g* acting as the second exposure mask for green.

The mask patterns 511 and 521 of the left mask portion 51*g* and the central mask portion 52*g* include the openings 512 and 522, in each of which one color layer 43*g* corresponding to two same-color sub pixels 14*g* adjacent to the spacer 49 is to be formed.

FIG. 2 shows the mask joints with white arrows. Such a mask joint is located between two same-color sub pixels 14 included in the BM 42, but is not located at a border between two multi-pixels 13 adjacent to each other in the up-down direction.

Figure 11:
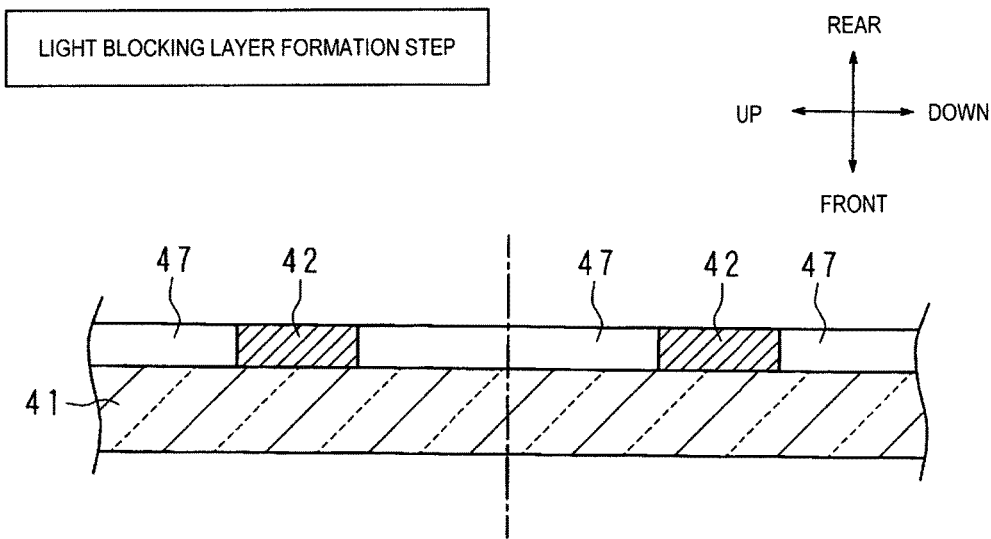
FIG. 11 is a cross-sectional view showing the method for producing the liquid crystal display apparatus in embodiment 1 according to the present invention.
Figure 12:
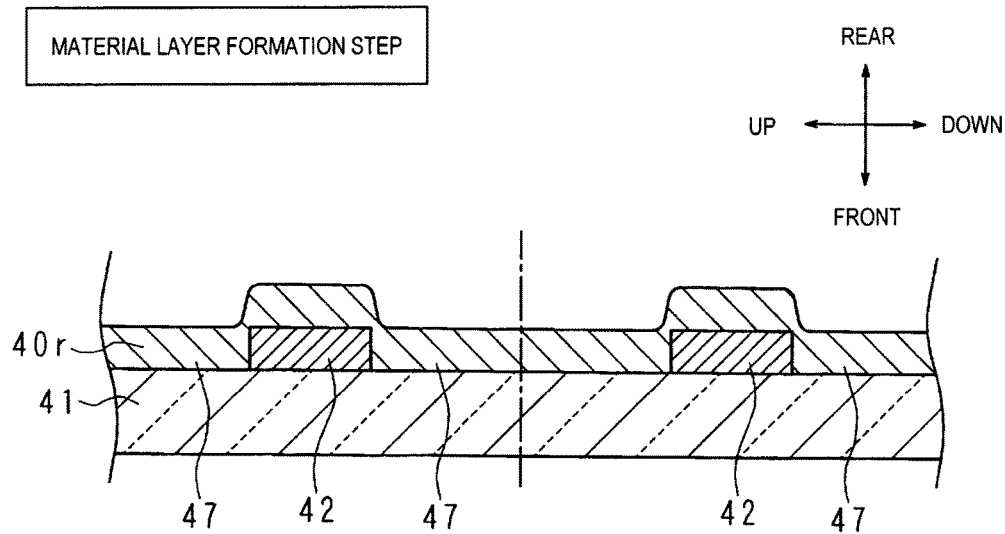
FIG. 12 is a cross-sectional view showing the method for producing the liquid crystal display apparatus in embodiment 1 according to the present invention.
Figure 13:
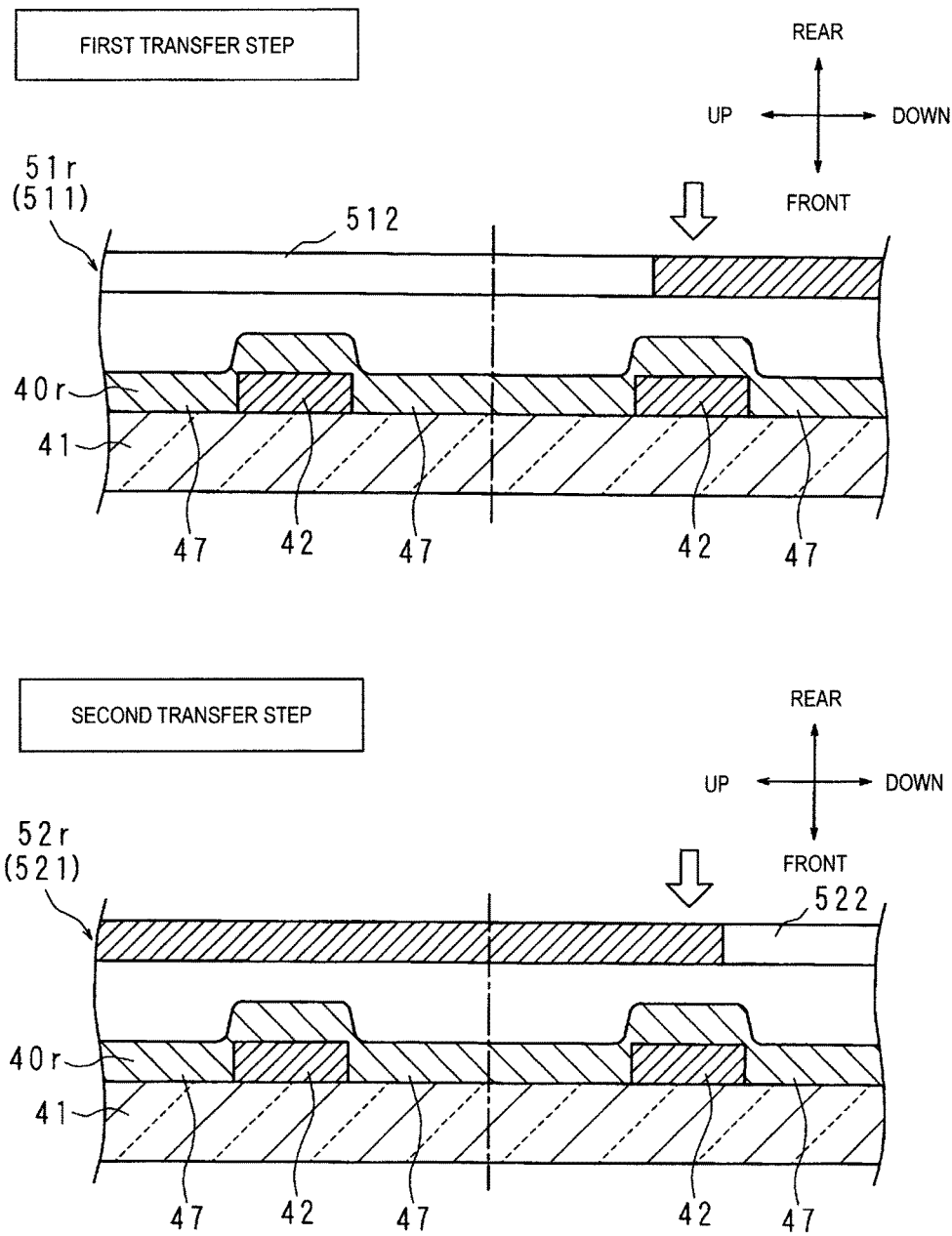
FIG. 13 provides cross-sectional views showing the method for producing the liquid crystal display apparatus in embodiment 1 according to the present invention.
Figure 14:
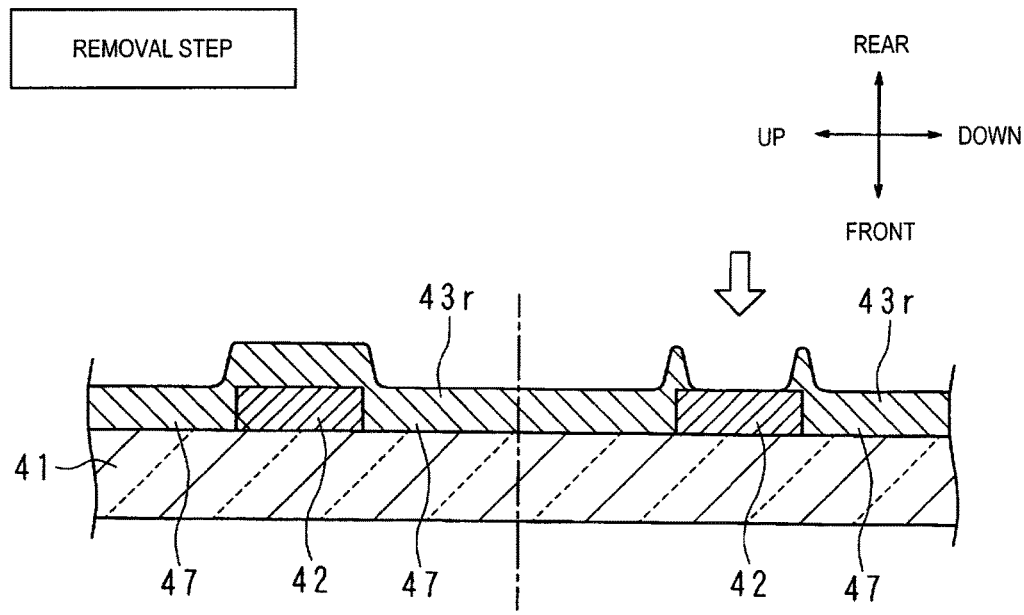
FIG. 14 is a cross-sectional view showing the method for producing the liquid crystal display apparatus in embodiment 1 according to the present invention.
Figure 15:
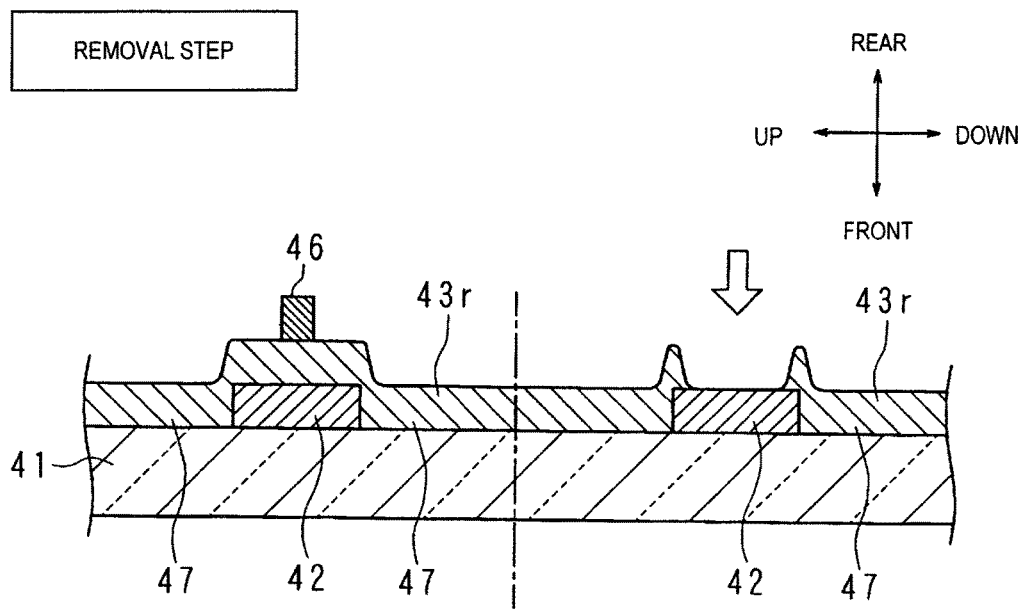
FIG. 15 is a cross-sectional view showing the method for producing the liquid crystal display apparatus in embodiment 1 according to the present invention.
Figure 16:
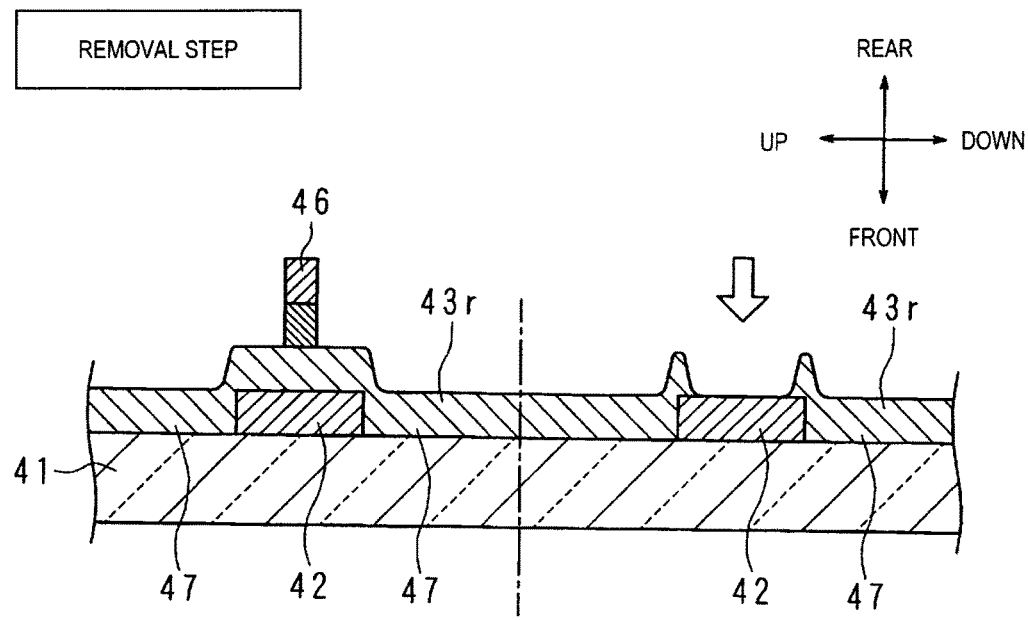
FIG. 16 is a cross-sectional view showing the method for producing the liquid crystal display apparatus in embodiment 1 according to the present invention.

FIG. 11 through FIG. 16 are cross-sectional views showing a method for producing the liquid crystal display apparatus 1. FIG. 11 shows a light blocking layer formation step, and FIG. 12 shows a material layer formation step for red. An upper part of FIG. 13 shows a first transfer step for red, and a lower part of FIG. 13 shows a second transfer step for red. FIG. 14, FIG. 15 and FIG. 16 respectively show removal steps for red, green and blue. In FIG. 13 through FIG. 16, the mask joint is shown with a white arrow.

FIG. 11 through FIG. 16 each show the openings 47. An upper half of each opening 47 corresponds to the lower sub pixel 14 of the multi-pixel 13 at an even-numbered row (e.g., Mth row) and the {N+1}th column. A lower half of each opening 47 corresponds to the upper sub pixel 14 of the multi-pixel 13 at an odd-numbered row (e.g., {M+1}th row) and the {N+1}th column. In FIG. 13 through FIG. 16, the border between two sub pixels 14 is shown with the one-dot chain line.

Except for a color layer formation step, the method for producing the liquid crystal display apparatus 1 in embodiment 1 according to the present invention may be substantially the same as a conventional method for producing a liquid crystal display apparatus.

The light blocking layer formation step and the color layer formation step are performed in this order, so that the counter substrate 4 is formed.

The color layer formation step includes the material layer formation step, the first transfer step, the second transfer step and the removal step for red; the material layer formation step, the first transfer step, the second transfer step and the removal step for green; and the material layer formation step, the first transfer step, the second transfer step and the removal step for blue. The material layer formation step, the first transfer step, the second transfer step and the removal step are performed in this order for each color.

In the light blocking layer formation step shown in FIG. 11, the BM 42 including a plurality of the openings 47 is formed on the rear surface of the light-transmissive plate 41. Such a step of forming the BM 42 is substantially the same as a step of forming a BM included in a conventional counter substrate.

In the case where a BM mask joint of the BM 42 is to be provided between two same-color sub pixels 14, it is desirable that the BM mask joint is provided between two same-color sub pixels 14 except for sets of two same-color sub pixels 14 adjacent to the spacer 46 and the spacers 49. A reason for this is as follows. The BM mask joint in the color material layer, which is to become the BM 42, is exposed to light twice, and therefore, the BM mask joint is made thicker than the remaining portion of the BM 42.

If there are spacers 46 located at such a thick portion of the BM 42 and also there are spacers 46 located at a thin portion of the BM 42, the spacers 46 are significantly varied in the length from the light-transmissive plate 41. Therefore, the cell gap is made non-uniform.

In the material layer formation step for red shown in FIG. 12, a color material layer 40r is formed in the openings 47 that are not closed and on the rear surface of the BM 42.

In the first transfer step for red shown in FIG. 13, the color material layer 40r is exposed to light by use of the left mask portion 51r. In this step, the mask pattern 511 of the left mask portion 51r is transferred to a predetermined area in a left portion of the color material layer 40r.

In the second transfer step for red shown in FIG. 13, the color material layer 40r is exposed to light by use of the central mask portion 52r. In this step, the mask pattern 521 of the central mask portion 52r is transferred to a predetermined area of the color material layer 40r that is to the right of, and partially overlapping, the area to which the mask pattern 511 of the left mask portion 51r has been transferred.

Although not shown, the color material layer 40r is further exposed to light by use of the central mask portion 52r. In this step, the mask pattern 521 of the central mask portion 52r is transferred to a predetermined area of the color material layer 40r that is to the right of, and partially overlapping, the area to which the mask pattern 521 of the central mask portion 52r has been transferred.

Although not shown, the color material layer 40r is further exposed to light by use of the right mask portion 53r. In this step, the mask pattern 531 of the right mask portion 53r is transferred to a predetermined area of the color material layer 40r that is to the right of, and partially overlapping, the area to which the mask pattern 521 of the central mask portion 52r has been transferred immediately previously.

In the removal step for red shown in FIG. 14, non-exposed regions of the color material layer 40r are removed. As a result, the color layers 43r are formed.

Both of two ends, in the up-down direction, of each color layer 43r are located between two same-color sub pixels 14r included in the multi-pixels 13 in an even-numbered row. In such a region, the light blocking portion of the BM 42 is located. Therefore, both of the two ends, in the up-down direction, of the color layer 43r are shielded against light.

The thickness difference between a region between two same-color sub pixels 14r and a region between another two same-color sub pixels 14r included in multi-pixels 13 in odd-numbered rows is small (see FIG. 14).

A reason for this is as follows. In the region between two same-color sub pixels 14r included in each multi-pixel 13 in an odd-numbered row, a central portion, in the up-down direction, of one color layer 43r is formed on the light blocking portion of the BM 42 in one opening 512 (see FIG. 13). The central portions, in the up-down direction, of the color layers 43r have a small thickness difference from each other.

The material layer formation step, the first transfer step, the second transfer step and the removal step for green are performed in substantially the same manner as the material layer formation step, the first transfer step, the second transfer step and the removal step for red. As a result, the color layers 43g, a front half of the spacer 46 to be provided between two same-color sub pixels 14r included in each multi-pixel 13 in an odd-numbered row, and the spacer 49 to be provided between two same-color sub pixels 14b included in each multi-pixel 13 in an odd-numbered row are formed (see FIG. 15).

The material layer formation step, the first transfer step, the second transfer step and the removal step for blue are performed in substantially the same manner as the material layer formation step, the first transfer step, the second transfer step and the removal step for red. As a result, the color layers 43b, a rear half of the spacer 46 to be provided between two same-color sub pixels 14r included in each multi-pixel 13 in an odd-numbered row, and the spacer 49 to be provided between two same-color sub pixels 14g included in each multi-pixel 13 in an odd-numbered row are formed (see FIG. 16).

In the above-described liquid crystal display apparatus 1, the spacers 46 and 49 are located at positions where the thickness difference is small but not located at positions where the thickness difference is large.

The spacers 46 are located between the TFT substrate 3 and the counter substrate 4. Therefore, the cell gap between the TFT substrate 3 and the counter substrate 4 is made uniform. As a result, the display quality of the liquid crystal display apparatus 1 is improved.

If the spacers 46 and 49 are located at positions where the thickness difference is large, such spacers 46 and 49 have an adverse influence on the cell gap between the TFT substrate 3 and the counter substrate 4. Namely, the cell gap is not made uniform.

Now, another technique for locating spacers 46 at a position other than a position where the thickness difference from the remaining portion is large, such as a mask joint or the like, will be discussed.

Even if a mask joint is located between two same-color sub pixels 14, as long as the spacer 46 is located between two multi-pixels 13 adjacent to each other in the up-down direction, the thickness difference caused by the mask joint does not make the cell gap non-uniform.

As long as the mask joint is located between two multi-pixels 13 adjacent to each other in the up-down direction, the thickness difference caused by the mask joint does not make the cell gap non-uniform.

However, the structure in which the spacer 46 or the mask joint is located between two multi-pixels 13 adjacent to each other in the up-down direction is more disadvantages than the structure in which the spacer 46 or the mask joint is located between two same-color sub pixels 14. A reason for this is as follows. The light blocking portion of the BM 42 is not located between two multi-pixels 13 adjacent to each other in the up-down direction. Therefore, the spacer 46 or the mask joint is located at a position corresponding to the opening 47, which adversely influences the display quality of the liquid crystal display apparatus 1.

If the light blocking portion of the BM 42 is located between two multi-pixels 13 adjacent to each other in the up-down direction in order to avoid the above-described situation, the numerical aperture of the BM 42 is decreased. In addition, when a liquid crystal material is put into the space between the TFT substrate 3 and the counter substrate 4 to form the liquid crystal layer 23, the flow of the liquid crystal material is inhibited by the degree corresponding to the light blocking portion of the BM 42 newly provided. The liquid crystal material, the flow of which is inhibited, is not diffused sufficiently between the TFT substrate 3 and the counter substrate 4. This adversely influences the display quality of the liquid crystal display apparatus 1.

In the liquid crystal display apparatus 1, the mask joint is located with four sub pixels 14 for two multi-pixels 13 being considered as one unit. As compared with the case where the mask joint is located with two sub pixels 14 for one multi-pixel 13 being considered as one unit as in the conventional art, the so-called mosaic irregularity is more conspicuous.

However, as long as the liquid crystal display apparatus 1 has a resolution of, for example, 4 k, the degree of the mosaic irregularity of the liquid crystal display apparatus 1 is not much different from that of a conventional liquid crystal display apparatus of a full HD resolution. Namely, the mosaic irregularity of the liquid crystal display apparatus 1 does not adversely influence the display quality thereof.

For the above-described reasons, the liquid crystal display apparatus 1 is more advantageous than a conventional liquid crystal display apparatus.

In embodiment 1, the spacers 46 and 49 are each located on one color layer 43. The spacers 46 and 49 are not limited to being provided in such an arrangement, and may each be located between two color layers 43. In this case, a region between the two color layers 43 on which the spacers 46 and 49 are each located need to be a non-mask joint (e.g., a region between two same-color sub pixels 14 included in a multi-pixel 13 at the {M+2}th row and the {N+1}th column).

Liquid crystal display apparatuses 1 in embodiments 2 through 5 described below have substantially the same structure as that of the liquid crystal display apparatus 1 in embodiment 1. Hereinafter, differences thereof from the liquid crystal display apparatus 1 in embodiment 1 will be described. Elements corresponding to those in embodiment 1 will bear the same reference signs and descriptions thereof will be omitted.

Embodiment 2

Figure 17:
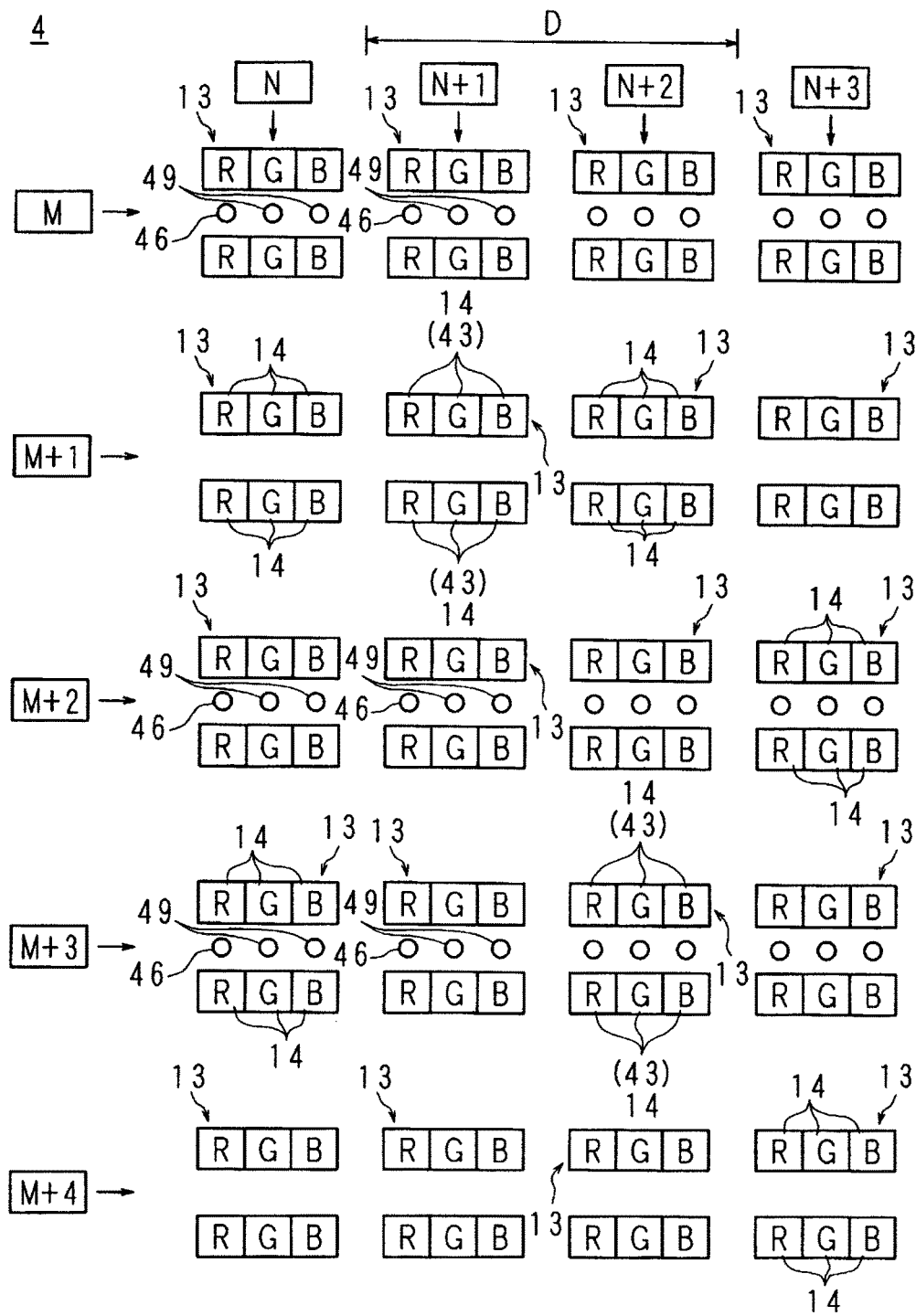
FIG. 17 is a cross-sectional view schematically showing a structure of a counter substrate included in a liquid crystal display apparatus produced by a method for producing a liquid crystal display apparatus in embodiment 2 according to the present invention.

FIG. 17 is a front view schematically showing a structure of a counter substrate 4 included in a liquid crystal display apparatus 1 produced by a method for producing a liquid crystal display apparatus in embodiment 2 according to the present invention. FIG. 17 corresponds to FIG. 3 in embodiment 1.

Figure 18:
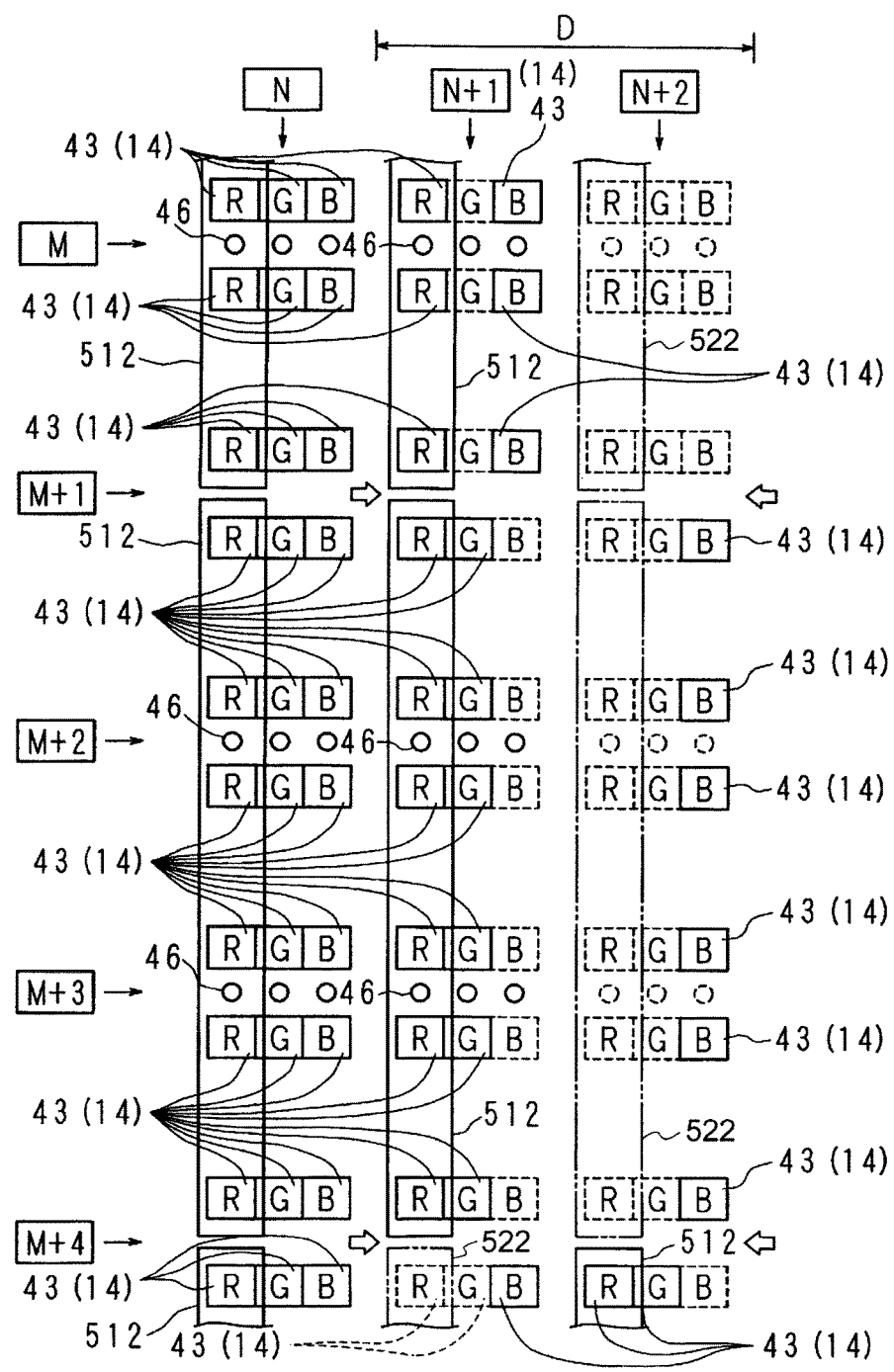
FIG. 18 is a front view schematically showing color layers and spacers formed by use of first exposure masks for the RGB three primary colors in embodiment 2 according to the present invention.

FIG. 18 is a front view schematically showing color layers and spacers formed by use of first exposure masks for the RGB three primary colors in embodiment 2 according to the present invention.

Figure 19:
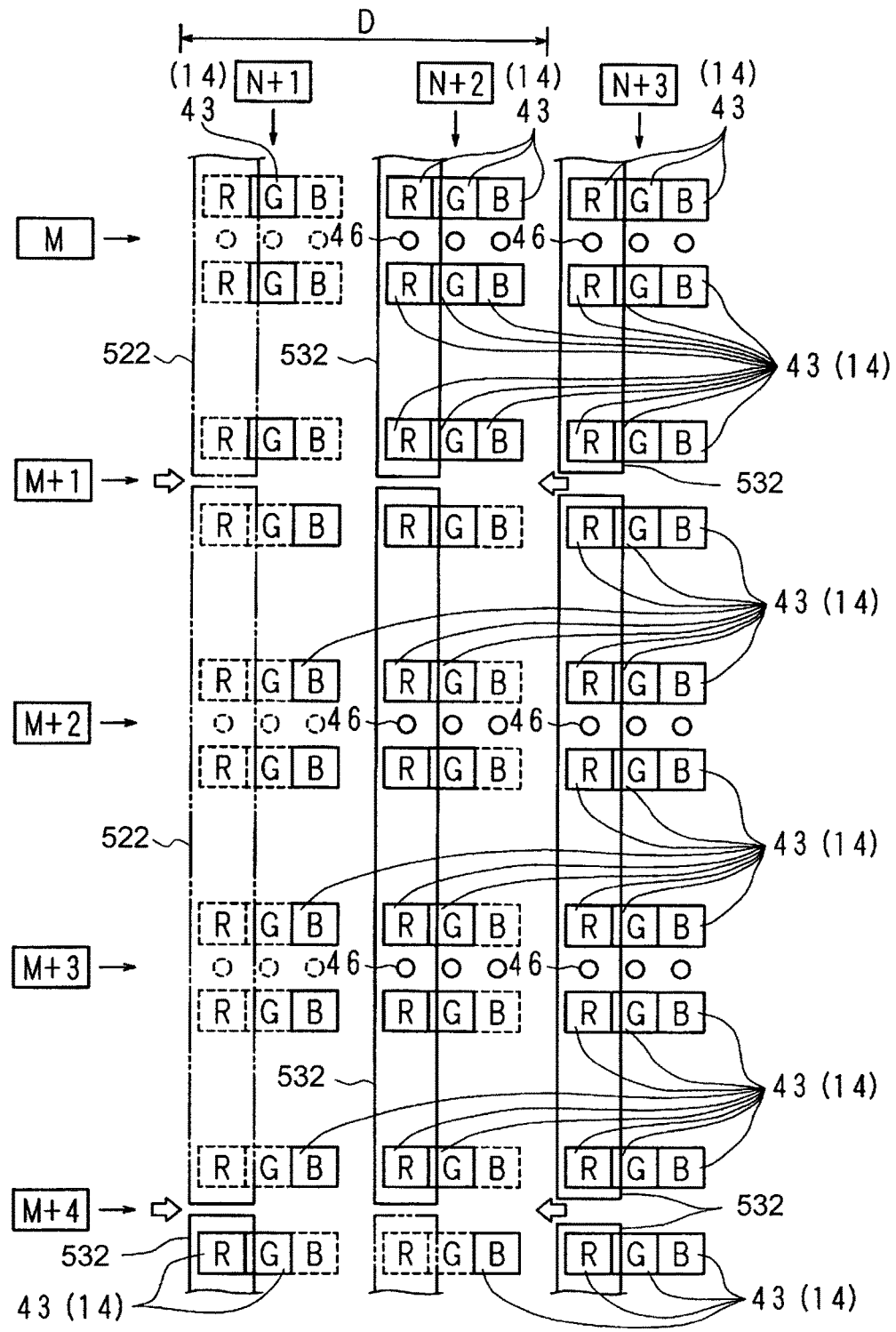
FIG. 19 is a front view schematically showing color layers and spacers formed by use of second exposure masks for the RGB three primary colors in embodiment 2 according to the present invention.

FIG. 19 is a front view schematically showing color layers and spacers formed by use of second exposure masks for the RGB three primary colors in embodiment 2 according to the present invention.

In this embodiment, left mask portions 51*r*, 51*g* and 51*b* are respectively described as the first exposure masks for the RGB three primary colors. Central mask portions 52*r*, 52*g* and 52*b* are respectively described as the second exposure masks for the RGB three primary colors.

In FIG. 18, openings 512 included in a mask pattern 511 of the left mask portion 51*r* are shown with the thick solid lines. Openings 522 included in a mask pattern 521 of the central mask portion 52*r* are shown with the two-dot chain lines.

In FIG. 18, sub pixels 14 including the color layers 43, spacers 46 and spacers 49, which are to be formed in the openings 512 in the left mask portions 51*r*, 51*g* and 51*b*, are shown with the thin solid lines. The other sub pixels 14, spacers 46 and spacers 49 are shown with the thin dashed lines.

In FIG. 19, the openings 532 included in the mask pattern 531 of the right mask portion 53*r* are shown with the thick solid lines. The openings 522 included in the mask pattern 521 of the central mask portion 52*r* are shown with the two-dot chain lines.

In FIG. 19, the sub pixels 14 including the color layers 43, spacers 46 and spacers 49, which are to be formed in the openings 532 in the right mask portions 53*r*, 53*g* and 53*b*, are shown with the thin solid lines. The other sub pixels 14, spacers 46 and spacers 49 are shown with the thin dashed lines.

In FIG. 18 and FIG. 19, the locations of the sub pixels 14, the spacers 46, and the spacers 49 correspond to the locations thereof in FIG. 17.

FIG. 18 and FIG. 19 show mask joints with white arrows.

As shown in FIG. 17, in the liquid crystal display apparatus 1 in this embodiment, three spacers (i.e., one spacer 46 and two spacers 49) are located in each of multi-pixels 13 in the uppermost row and the lowermost row of each set of three rows (namely, {M+(3×k)}th row and {M+(3×k+2)}th row). By contrast, no spacer 46 or 49 is located in multi-pixels 13 in the central row in the up-down direction of each set of three rows (namely, {M+(3×k+1)}th row). Herein, k=0, 1, 2, . . . .

As shown in FIG. 18 and FIG. 19, the mask patterns 511, 521 and 531 include openings 512, 522 and 532, in each of which one color layer 43*r* corresponding to two same-color sub pixels 14*r* adjacent to the spacer 46 is to be formed.

The openings 512, 522 and 532 each have a size corresponding to six red sub pixels 14*r* adjacent to each other in the up-down direction. The number of the sub pixels, namely, six, is the same as the total number of red sub pixels 14*r* included in three multi-pixels 13. The number of the sub pixels, namely, six, is also the same as the total number of two sub pixels 14*r* included in each of two multi-pixels 13 and one sub pixel 14*r* included in each of two multi-pixels 13.

Therefore, in embodiment 2 also, a region between two red sub pixels 14*r* adjacent to the spacer 46 is a non-mask joint.

A region between two green sub pixels 14g adjacent to the spacer 49 is a non-mask joint, and a region between two blue sub pixels 14b adjacent to the spacer 49 is also a non-mask joint.

The exposure masks 5, more specifically, the coarse-dense portions of the mask patterns 511, 521 and 531, are designed as follows. The sub pixels 14 for three multi-pixels 13 are set as one unit. An opening is set for each unit: Then, it is determined whether the set opening is to be formed in the left mask portion 51, the central mask portion 52, or the right mask portion 53.

The liquid crystal display apparatus 1 having the above-described structure is produced by substantially the same method as the liquid crystal display apparatus 1 in embodiment 1.

The number of the spacers 46 included in the liquid crystal display apparatus 1 in this embodiment are greater than that in the liquid crystal display apparatus 1 in embodiment 1. Therefore, the cell gap is made uniform with more certainty in this embodiment.

In embodiments 1 and 2, the mask joints (or the non-mask joints) are arranged in straight lines in the left-right direction. Thus, the exposure masks 5 are easily designed.

In embodiments 1 and 2, the multi-pixels 13 in which the spacers 46 and 49 are located are arranged in the left-right direction, and the multi-pixels 13 in which the spacers 46 and 49 are not located are arranged in the left-right direction. Alternatively, such multi-pixels 13 may be arranged in the up-down direction.

Embodiment 3

Figure 20:
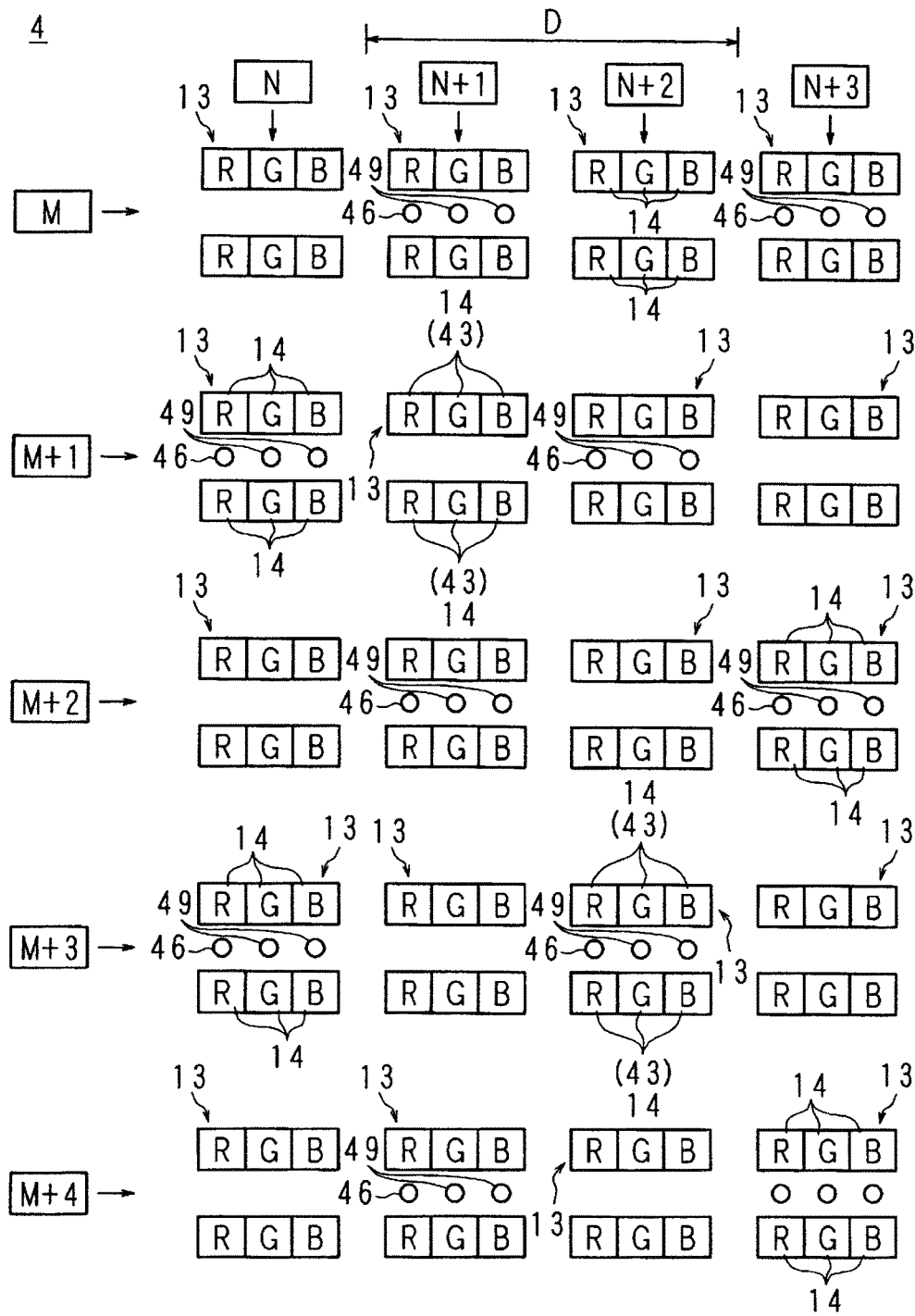
FIG. 20 is a cross-sectional view schematically showing a structure of a counter substrate included in a liquid crystal display apparatus produced by a method for producing a liquid crystal display apparatus in embodiment 3 according to the present invention.

FIG. 20 is a front view schematically showing a structure of a counter substrate 4 included in a liquid crystal display apparatus 1 produced by a method for producing a liquid crystal display apparatus in embodiment 3 according to the present invention.

Figure 21:
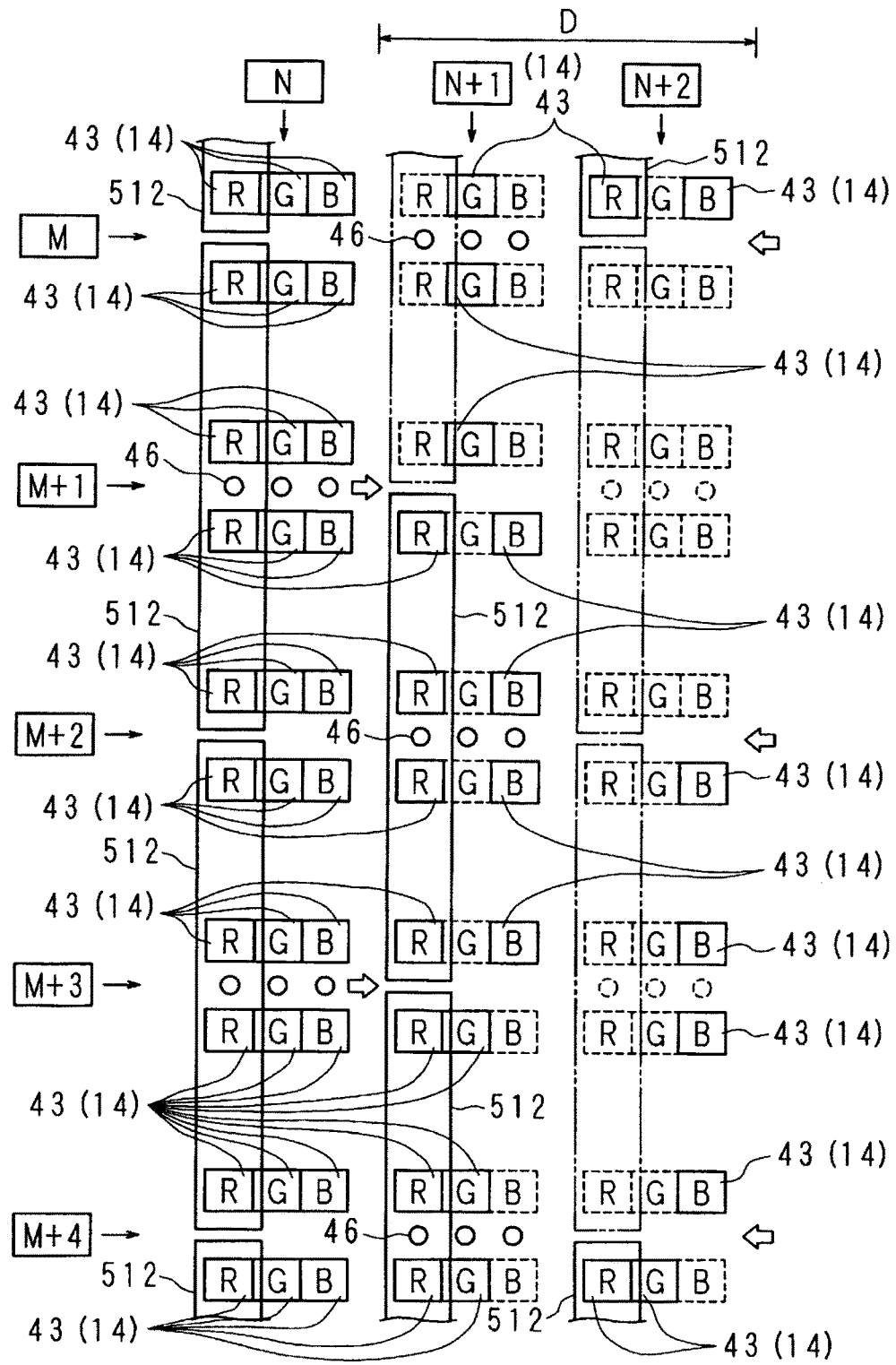
FIG. 21 is a front view schematically showing color layers and spacers formed by use of first exposure masks for the RGB three primary colors in embodiment 3 according to the present invention.

FIG. 21 is a front view schematically showing color layers and spacers formed by use of first exposure masks for the RGB three primary colors in embodiment 3 according to the present invention.

Figure 22:
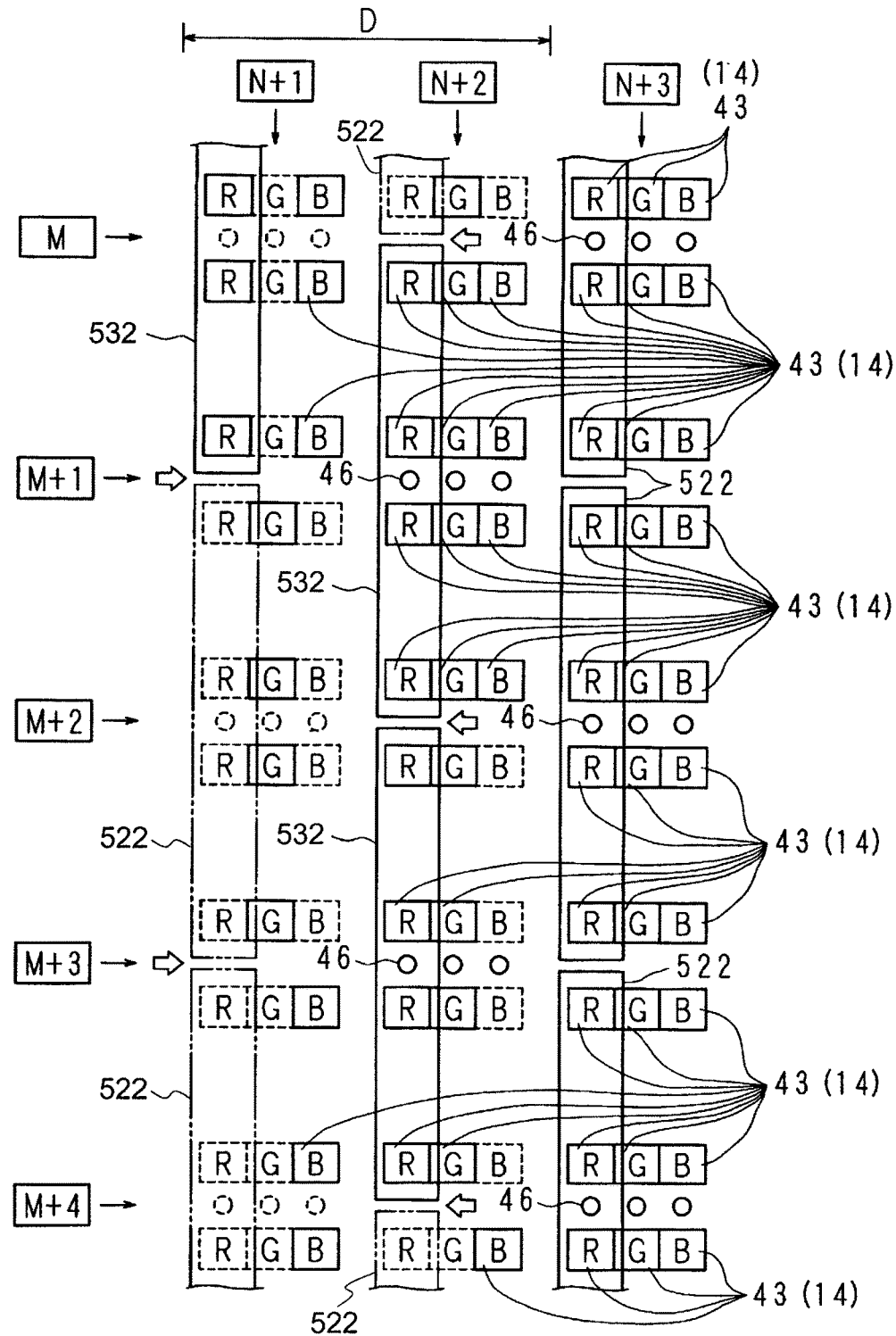
FIG. 22 is a front view schematically showing color layers and spacers formed by use of second exposure masks for the RGB three primary colors in embodiment 3 according to the present invention.

FIG. 22 is a front view schematically showing color layers and spacers formed by use of second exposure masks for the RGB three primary colors in embodiment 3 according to the present invention.

FIG. 20 through FIG. 22 correspond to FIG. 17 through FIG. 19 in embodiment 2.

As shown in FIG. 20, in the liquid crystal display apparatus 1 in this embodiment, the multi-pixels 13 in each of which the spacer 46 and the spacers 49 are located, and the multi-pixels 13 in each of which neither the spacer 46 nor the spacers 49 are located, are arranged in a houndstooth check pattern.

As shown in FIG. 21 and FIG. 22, the mask patterns 511, 521 and 531 include openings 512, 522 and 532, in each of which one color layer 43r corresponding to two same-color sub pixels 14r adjacent to the spacer 46 is to be formed.

The openings 512, 522 and 532 each have a size corresponding to four red sub pixels 14r adjacent to each other in the up-down direction. The number of the sub pixels, namely, four, is the same as the total number of red sub pixels 14r included in two multi-pixels 13. The number of the sub pixels, namely, four, is also the same as the total number of two sub pixels 14r included in one multi-pixel 13 and one sub pixel 14r included in each of two multi-pixels 13.

Therefore, in embodiment 3 also, a region between two red sub pixels 14r adjacent to the spacer 46 is a non-mask joint.

A region between two green sub pixels 14g adjacent to the spacer 49 is a non-mask joint, and a region between two blue sub pixels 14b adjacent to the spacer 49 is also a non-mask joint.

The exposure masks 5, more specifically, the coarse-dense portions of the mask patterns 511, 521 and 531, are designed as follows. The sub pixels 14 for two multi-pixels 13 are set as one unit. An opening is set for each unit. Then, it is determined whether the set opening is to be formed in the left mask portion 51, the central mask portion 52, or the right mask portion 53.

The liquid crystal display apparatus 1 having the above-described structure is produced by substantially the same method as the liquid crystal display apparatus 1 in embodiment 1.

The liquid crystal display apparatus 1 in this embodiment has a still higher display quality than that of the liquid crystal display apparatus 1 in embodiment 1.

A reason for this is as follows. In the liquid crystal display apparatus 1 in embodiment 1, the mask joints are located in straight lines (namely, the portions that may adversely influence the display quality are positionally concentrated). By contrast, in the liquid crystal display apparatus 1 in this embodiment, the mask joints are located in a houndstooth check pattern (namely, the portions that may adversely influence the display quality are dispersed).

Embodiment 4

Figure 23:
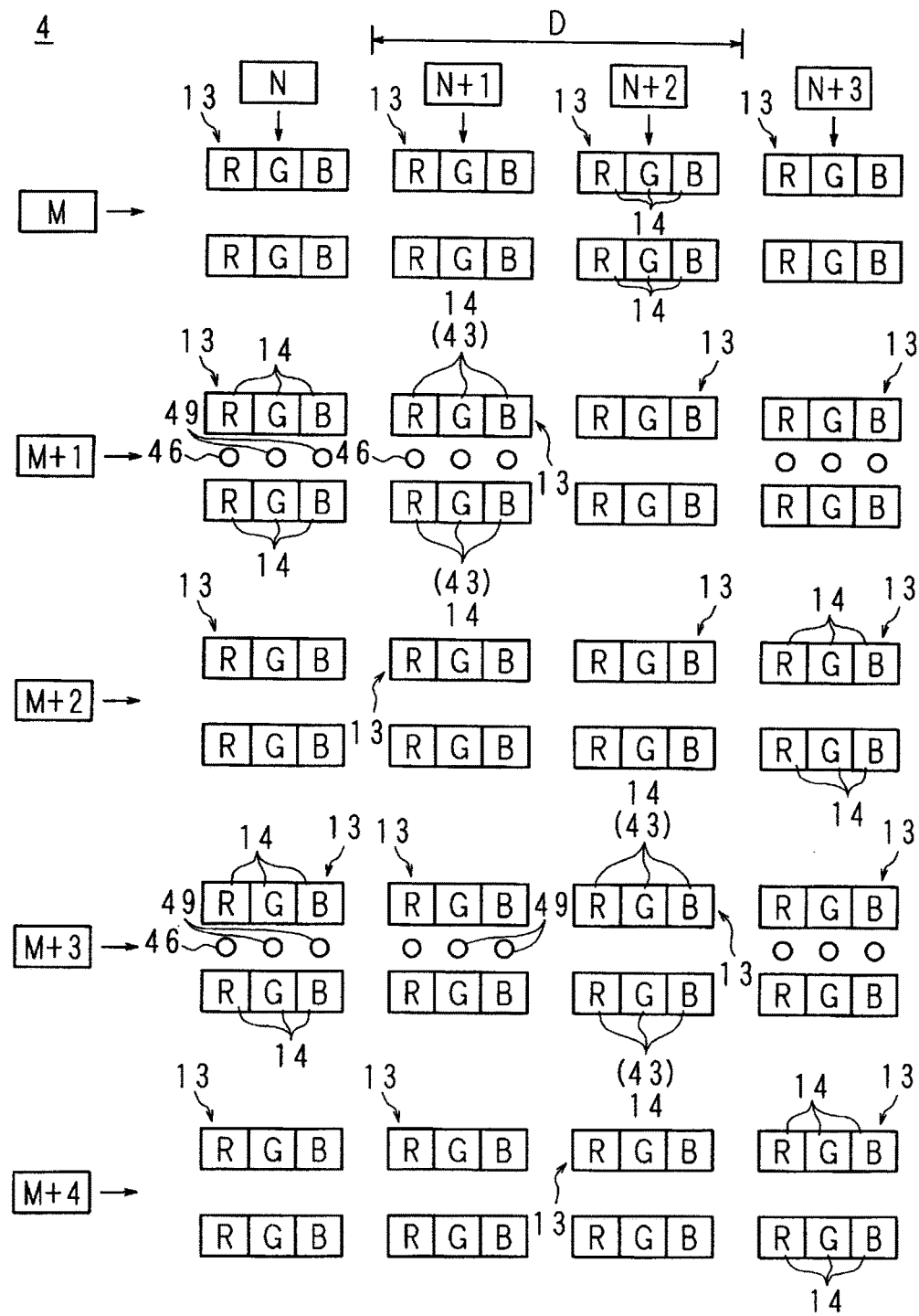
FIG. 23 is a cross-sectional view schematically showing a structure of a counter substrate included in a liquid crystal display apparatus produced by a method for producing a liquid crystal display apparatus in embodiment 4 according to the present invention.

FIG. 23 is a front view schematically showing a structure of a counter substrate 4 included in a liquid crystal display apparatus 1 produced by a method for producing a liquid crystal display apparatus in embodiment 4 according to the present invention. FIG. 23 corresponds to FIG. 3 in embodiment 1.

Figure 24:
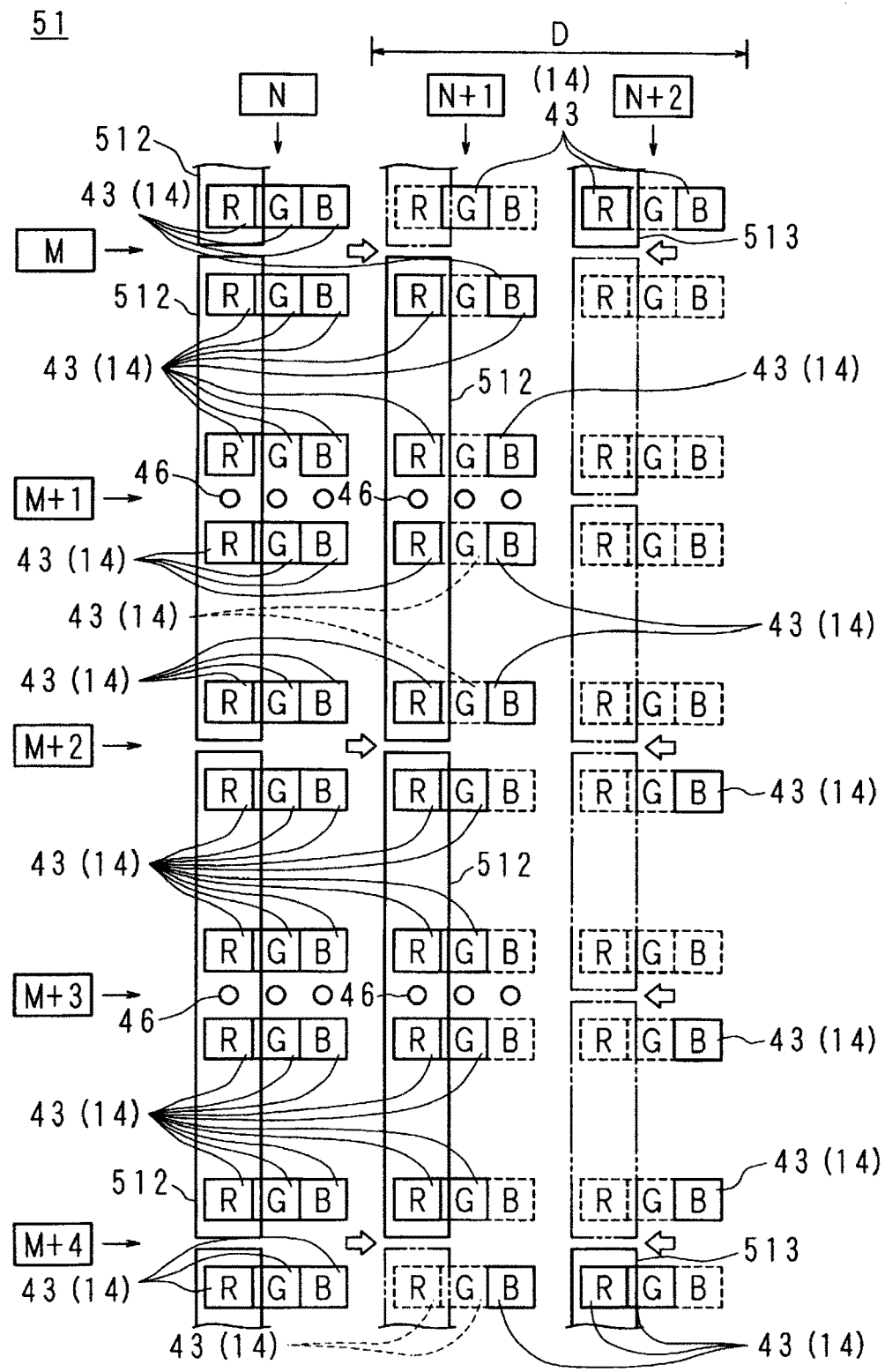
FIG. 24 is a front view schematically showing color layers and spacers formed by use of first exposure masks for the RGB three primary colors in embodiment 4 according to the present invention.

FIG. 24 is a front view schematically showing color layers and spacers formed by use of first exposure masks for the RGB three primary colors in embodiment 4 according to the present invention. FIG. 24 corresponds to FIG. 9 in embodiment 1.

Figure 25:
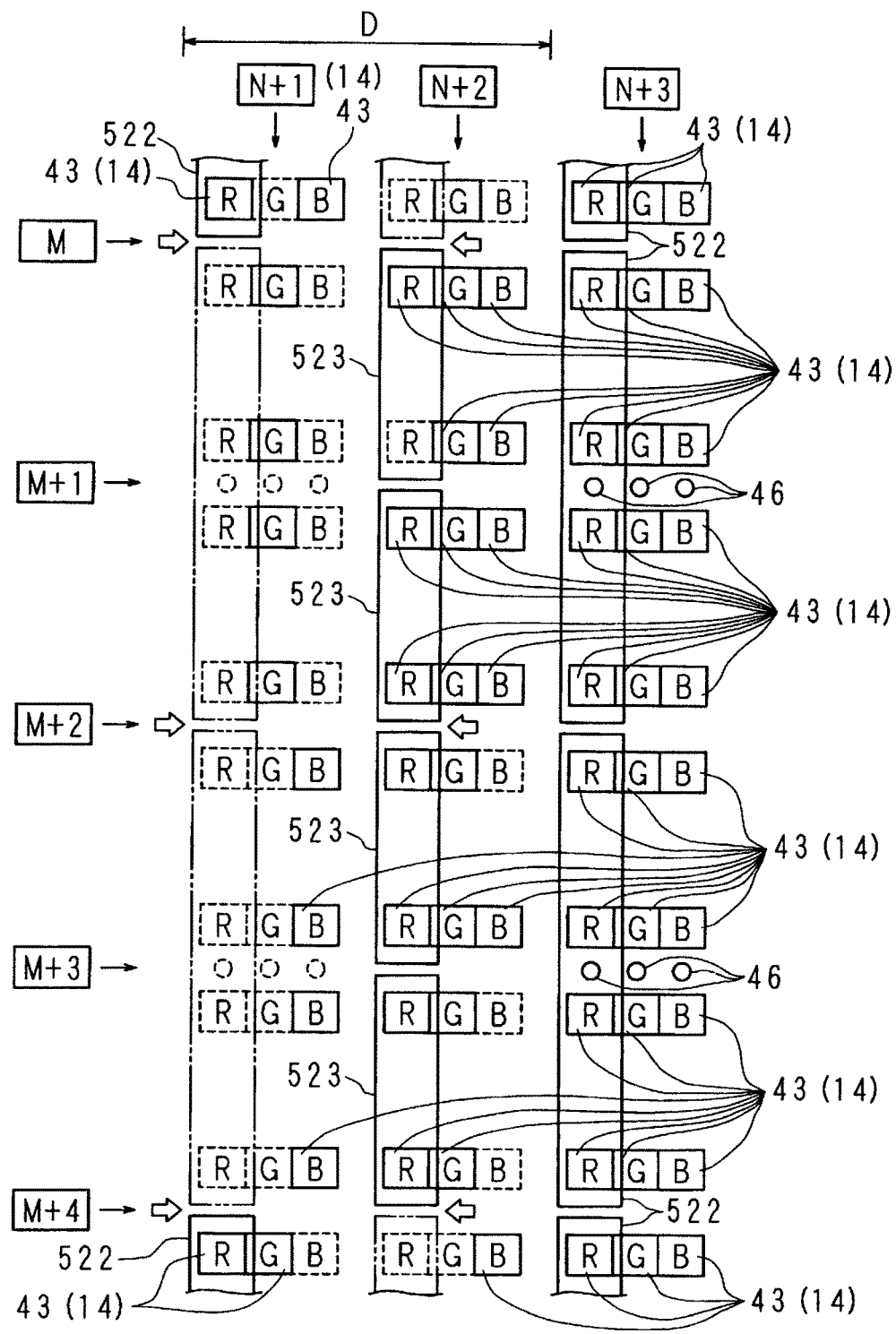
FIG. 25 is a front view schematically showing color layers and spacers formed by use of second exposure masks for the RGB three primary colors in embodiment 4 according to the present invention.

FIG. 25 is a front view schematically showing color layers and spacers formed by use of second exposure masks for the RGB three primary colors in embodiment 4 according to the present invention. FIG. 25 corresponds to FIG. 10 in embodiment 1.

As shown in FIG. 23, in the liquid crystal display apparatus 1 in this embodiment, one spacer 46 and two spacers 49 are located in each of the multi-pixels 13 located at the following positions: among the two left columns of each set of three columns (namely, {N+(3×k)}th column and {N+(3×k)+1}th column), the odd-numbered rows (namely, {M+1}th row, {M+3}th row, etc.). By contrast, no spacer 46 or 49 is located in multi-pixels 13 in the even-numbered rows (Mth row, {M+2}th row, {M+4}th row, etc.) in the above-mentioned columns. In other words, regarding the two left columns of each set of three columns, the structure of the liquid crystal display apparatus 1 in this embodiment is the same as that of the liquid crystal display apparatus 1 in embodiment 1.

In multi-pixels 13 in the right column of each set of three columns (namely, {N+(3×k)+2}th column), no spacer 46 or 49 is located.

As shown in FIG. 23 and FIG. 24, the mask patterns 511 and 521 respectively include openings 512 and 522 and also respectively include openings 513 and 523.

The openings 512 and 522 are provided for the (N+(3×k))th column and the {N+(3×k)+1}th column including the multi-pixels 13 in each of which the spacer 46 and the spacers 49 are located.

The openings 513 and 523 are provided for the {N+(3×k)+2}th column including only the multi-pixels 13 in which no spacer 46 or 49 is located.

The openings 512 and 522 each have a size corresponding to four red sub pixels 14*r* adjacent to each other in the up-down direction. The number of the sub pixels, namely, four, is the same as the total number of red sub pixels 14*r* included in two multi-pixels 13. The number of the sub pixels, namely, four, is also the same as the total number of two sub pixels 14*r* included in one multi-pixel 13 and one sub pixel 14*r* included in each of two multi-pixels 13.

Therefore, in embodiment 4 also, a region between two red sub pixels 14*r* adjacent to the spacer 46 is a non-mask joint.

A region between two green sub pixels 14*g* adjacent to the spacer 49 is a non-mask joint, and a region between two blue sub pixels 14*b* adjacent to the spacer 49 is also a non-mask joint.

The openings 513 and 523 each have substantially the same size as that of each opening included in a conventional exposure mask. More specifically, the openings 513 and 523 each have a size corresponding to two red sub pixels 14*r* adjacent to each other in the up-down direction. The number of the sub pixels, namely, two, is the same as the total number of red sub pixels 14*r* included in one multi-pixel 13.

The exposure masks 5, more specifically, the coarse-dense portions of the mask patterns 511 and 521, are designed as follows. Regarding the {N+(3×k)}th column and the {N+(3×k)+1}th column, the sub pixels 14 for two multi-pixels 13 are set as one unit, like in embodiment 1. An opening is set for each unit. Then, it is determined whether the set opening is to be formed in the left mask portion 51 or the central mask portion 52.

By contrast, regarding the {N+(3×k)+2}th column, the sub pixels 14 for one multi-pixel 13 are set as one unit as is done conventionally. An opening is set for each unit. Then, it is determined whether the set opening is to be formed in the left mask portion 51 or the central mask portion 52.

As can be seen, the openings may have different shapes or sizes from each other as long as the spacer 46 and the spacers 49 are located in a non-mask joint. As the size of the openings is smaller, the display quality is improved. Therefore, the liquid crystal display apparatus 1 in this embodiment has a still higher display quality than that of the liquid crystal display apparatus 1 in embodiment 1.

Embodiment 5

Figure 26:
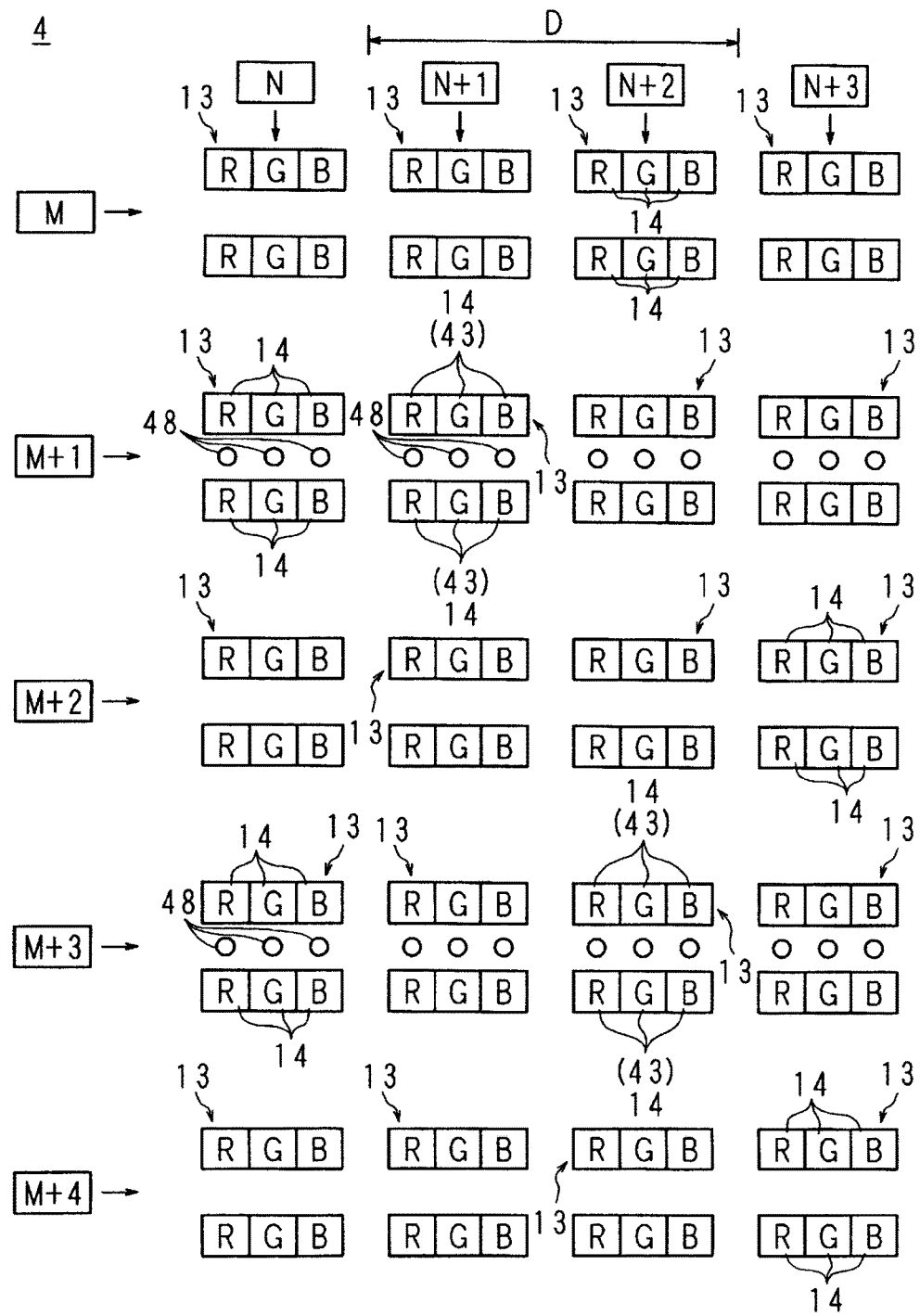
FIG. 26 is a cross-sectional view schematically showing a structure of a counter substrate included in a liquid crystal display apparatus produced by a method for producing a liquid crystal display apparatus in embodiment 5 according to the present invention.

FIG. 26 is a front view schematically showing a structure of a counter substrate 4 included in a liquid crystal display apparatus 1 produced by a method for producing a liquid crystal display apparatus in embodiment 5 according to the present invention.

Figure 27:
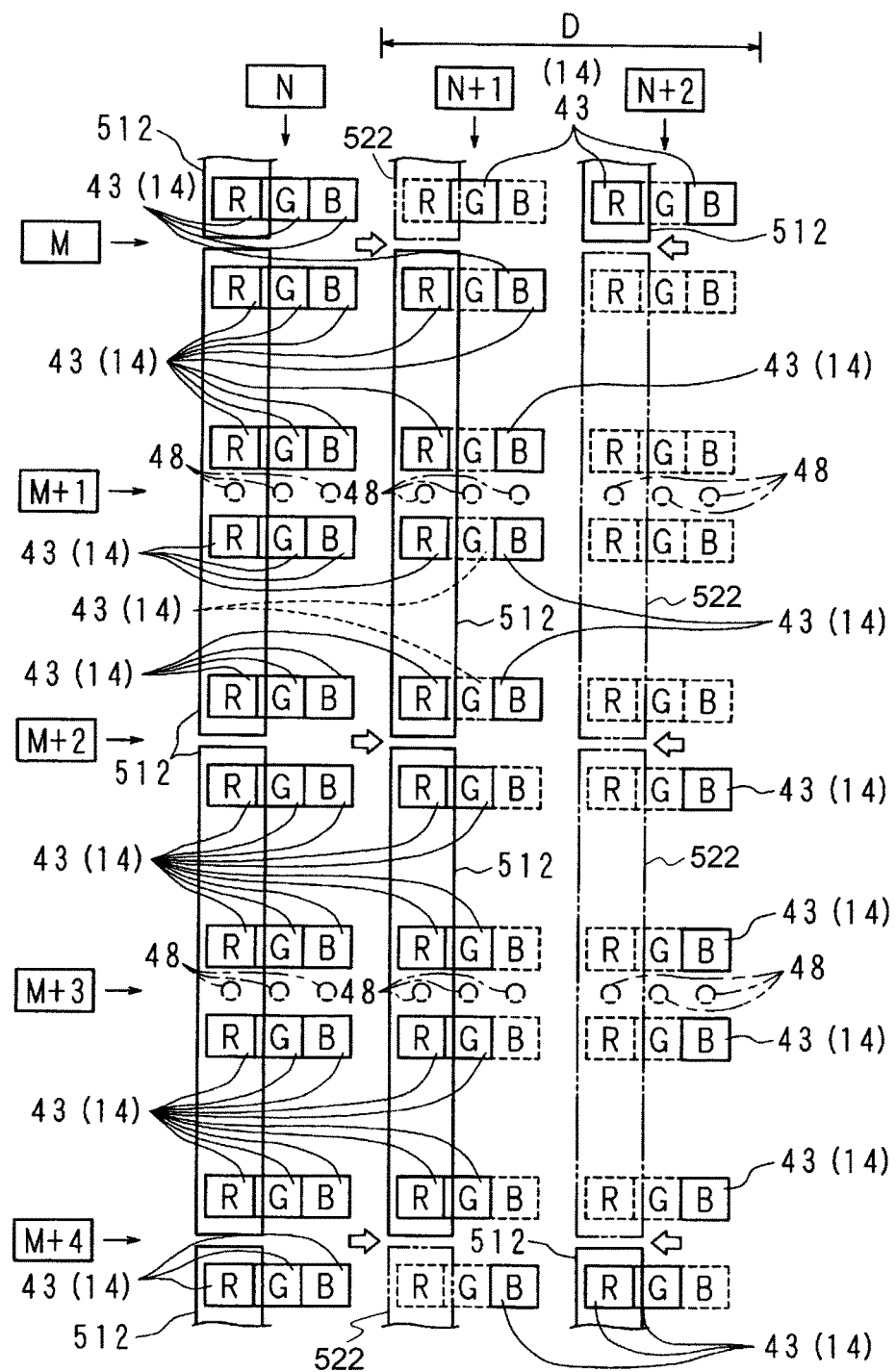
FIG. 27 is a front view schematically showing color layers and spacers formed by use of first exposure masks for the RGB three primary colors in embodiment 5 according to the present invention.

FIG. 27 is front view schematically showing color layers and spacers formed by use of first exposure masks for the RGB three primary colors in embodiment 5 according to the present invention.

Figure 28:
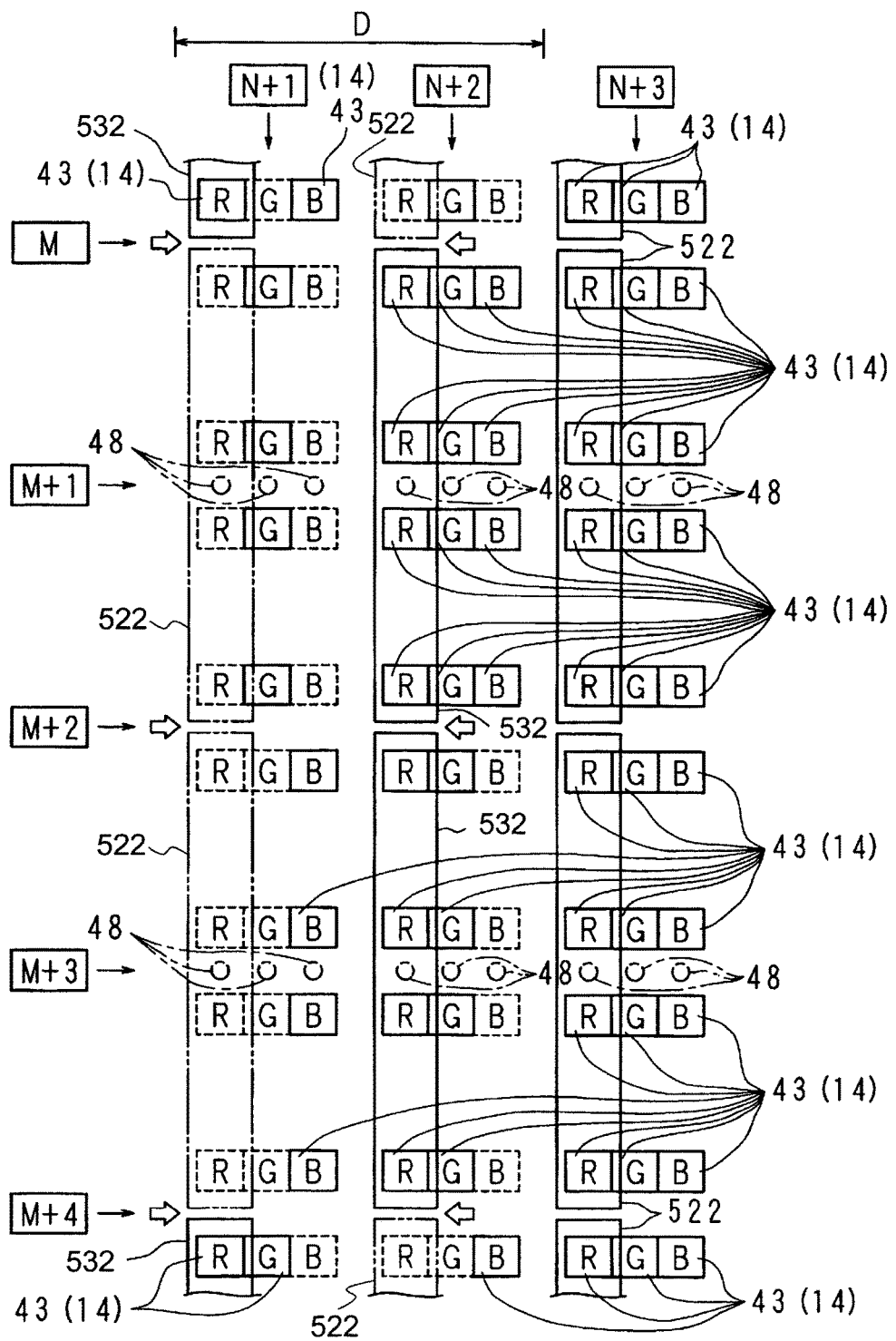
FIG. 28 is a front view schematically showing color layers and spacers formed by use of second exposure masks for the RGB three primary colors in embodiment 5 according to the present invention.

FIG. 28 is a front view schematically showing color layers and spacers formed by use of second exposure masks for the RGB three primary colors in embodiment 5 according to the present invention.

FIG. 26 through FIG. 28 respectively correspond to FIG. 17 through FIG. 19 in embodiment 2.

The liquid crystal display apparatus 1 in this embodiment includes spacers 48 instead of the spacer 46 and the spacers 49 in embodiment 1.

In embodiment 1, the spacer 46 and the spacers 49 are formed at the same time with the color layers 43 in the color layer formation step. Therefore, the spacer 46 and the spacers 49 contain the same material as that of the color layers 43.

In this embodiment, the spacers 48 are formed in a spacer formation step after the color layers 43 are formed in the color layer formation step. Therefore, the spacers 48 may contain the same material as that of the color layers 43, or may contain a material different from that of the color layers 43.

The spacers 48 each have substantially the same shape and substantially the same size as those of the spacer 46 in embodiment 1. The spacers 48 are each located between two same-color sub pixels 14*r*, between two same-color sub pixels 14*g*, or between two same-color sub pixels 14*b*.

In the liquid crystal display apparatus 1, three spacers 48 are located in each of multi-pixels 13 in the odd-numbered rows (i.e., {M+1}th row, {M+3}th row, etc.). By contrast, no spacer 48 is located in multi-pixels 13 in the even-numbered rows (i.e., Mth row, {M+2}th row, {M+4}th row, etc.).

The exposure masks 5 have mask patterns corresponding to the color layers 43 but do not have mask patterns corresponding to the spacers 48.

Figure 30:
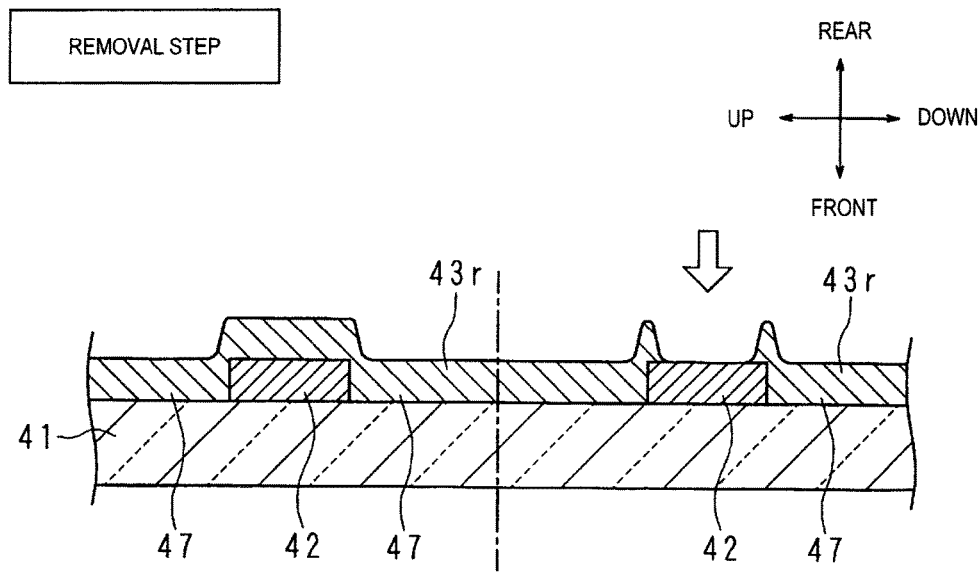
FIG. 30 is a cross-sectional view showing the method for producing the liquid crystal display apparatus in embodiment 5 according to the present invention.
Figure 31:
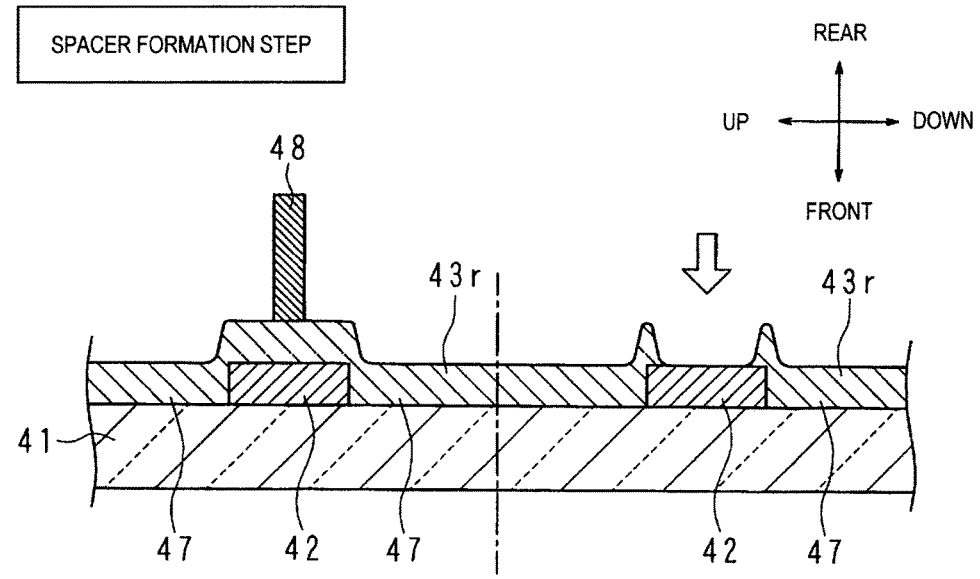
FIG. 31 is a cross-sectional view showing the method for producing the liquid crystal display apparatus in embodiment 5 according to the present invention.

FIG. 29 through FIG. 31 are cross-sectional views showing the method for producing the liquid crystal display apparatus 1 in this embodiment. An upper part of FIG. 29 shows a first transfer step for red, and a lower part of FIG. 29 shows a second transfer step for red. FIG. 30 shows a removal step for red. FIG. 31 shows a spacer formation step for red. FIG. 29, FIG. 30 and FIG. 31 respectively correspond to FIG. 13, FIG. 14 and FIG. 16 in embodiment 1.

The light blocking layer formation step, the color layer formation step and the spacer formation step are performed in this order, so that the counter substrate 4 is formed. The light blocking layer formation step and the color layer formation step in this embodiment are substantially the same as those in embodiment 1. It should be noted that in the color layer formation step in this embodiment, the left mask portion 51, the central mask portion 52 and the like having no mask pattern corresponding to the spacers 48 are used. Therefore, in the color layer formation step in this embodiment, the spacers 48 are not formed.

In the spacer formation step shown in FIG. 31, the spacers 48 are formed by photolithography.

Alternatively, the spacers 48 may be formed by any technique other than photolithography. The spacers 48 are all main spacers. Alternatively, the spacers 48 may be partially replaced with the spacers 49 used in embodiment 1.

In the counter substrate 4 in each of embodiments 1 through 5, the RGB three primary colors are arranged in a striped pattern. The counter substrate 4 is not limited to this, and the RGB three primary colors may be arranged in a mosaic or delta pattern.

In each of embodiments 1 through 5, the liquid crystal panel 11 includes the multi-pixels. The liquid crystal panel 11 is not limited to this. Alternatively, the liquid crystal panel 11 may include usual pixels instead of multi-pixels. In this case, the light blocking portion of the BM 42 is located between two usual pixels adjacent to each other in the up-down direction, and the spacer is located between two usual pixels adjacent to each other in the up-down direction. In the case where the usual pixels each include sub pixels for the RGB three primary colors, the spacer is located between the upper R sub pixel (or G or B sub pixel) and the lower R sub pixel (or G or B sub pixel).

In the liquid crystal display apparatus 1 in each of embodiments 1 through 3, the counter substrate 4 includes the BM 42, the color layers 43, and the spacers 46, 49. The liquid crystal display apparatus 1 is not limited to this. Alternatively, the TFT substrate 3 may include a BM, color layers and spacers corresponding to the BM 42, the color layers 43, and the spacers 46, 49.

In embodiments 1 through 3, three spacers (i.e., one spacer 46 and two spacers 49) are located in one multi-pixel 13. The structure of the multi-pixels 13 and the spacers is not limited to this. Alternatively, two or less, or four or more spacers 46, 49 may be located in one multi-pixel 13.

The BM, the color layers and the spacers are not limited to being all included in the TFT substrate 3 or the counter substrate 4.

For example, the TFT substrate 3 (or the counter substrate 4) may include the BM, whereas the counter substrate 4 (or the TFT substrate 3) may include the spacers and the color layers. In this case, the color layers do not close the openings in the BM, and are located to face with the openings.

Alternatively, the TFT substrate 3 (or the counter substrate 4) may include the BM and the color layers, whereas the counter substrate 4 (or the TFT substrate 3) may include the spacers.

Still alternatively, the TFT substrate 3 (or the counter substrate 4) may include the BM and the spacers, whereas the counter substrate 4 (or the TFT substrate 3) may include the color layers. In this case also, the color layers do not close the openings in the BM, and are located to face the openings.

In the liquid crystal display apparatus 1 in each of the embodiments according to the present invention, one sub pixel may correspond to one opening in the BM. Alternatively, J sub pixels (J sub pixels are a plurality of sub pixels) may correspond to one opening in the BM.

In the case where J sub pixels correspond to one opening in the BM, the opening in the BM may be divided into a plurality of portions by a light blocking member other than the light blocking portion of the BM (e.g., by a light blocking line). Such a light blocking member may be located in a plate-like member including the BM or a plate-like member not including the BM.

In the case where the opening in the BM is divided into a plurality of portions by the light blocking member, L sub pixels (L is a natural number satisfying L<J), among the J sub pixels, correspond to each of the divided portions. The spacer may be located at a position shielded against light by the light blocking portion of the BM, a position shielded against light by the light blocking member, or a position not shielded against light.

In the case where the opening in the BM is divided into a plurality of portions by the light blocking member, the color layers of different colors may respectively correspond to the divided portions.

The embodiments disclosed above are illustrative in any sense and are not to be construed as being limiting the present invention. The scope of the present invention is not limited by any of the above-described embodiments, but is intended to encompass the claims and equivalents thereof and also encompass all the modifications and alternatives of the claims.

The liquid crystal display apparatus or the counter substrate may include any element not disclosed in any of embodiments 1 through 5, as long as the effect of the present invention is provided.

The elements (technological features) disclosed in the embodiments may be combined with each other, and a new technological feature may be provided by such a combination.

What is claimed is:

1. A method for producing a liquid crystal display apparatus, the liquid crystal display apparatus comprising:
    two plate-like members facing each other while having a liquid crystal layer therebetween;
    spacers between the two plate-like members;
    a light blocking layer that is formed on one of the two plate-like members and includes a plurality of openings;
    a plurality of color layers having different colors from each other that are formed on one of the two plate-like members so as to close the plurality of openings or face the plurality of openings;
    wherein:
    a plurality of pixels each comprising a plurality of sub pixels each including one of the plurality of openings and one of the plurality of color layers are provided;
    for each of the different colors, the plurality of sub pixels included in each of the plurality of pixels include two or more sub pixels of the same color that are continuously arranged in one direction; and,
    for each of the different colors, the spacers each are located between two sub pixels of the same color that are adjacent to each other in the one direction;
    the method comprising:
    a step for forming the plurality of color layers comprising a color layer formation step of forming one of the plurality of color layers;
    wherein:
    the color layer formation step comprises:
        a material layer formation step of forming a color material layer of a certain color;
        a first transfer step of performing photolithography by use of a first exposure mask having a first mask pattern corresponding to a color layer of the certain color, so that the color layer closes first openings of the plurality of openings or faces the first openings, thereby transferring the first mask pattern to a first area of the color material layer;
        a second transfer step of performing photolithography by use of a second exposure mask having a second mask pattern corresponding to the color layer of the certain color, so that the color layer closes second openings, different from the first openings, of the plurality of openings or faces the second openings, thereby transferring the second mask pattern to a second area of the color material layer, the second area partially overlapping the first area; and
        a removal step of removing a non-exposed region of the color material layer after the first transfer step and the second transfer step;
    the color layer formation step is repeated as many times as the number of colors of the plurality of color layers;
    at least one of the first mask pattern and the second mask pattern includes mask openings in each of which the color layer, included in two sub pixels of the same color that are adjacent to each other in the one direction interposing at least one of the spacers therebetween, is to be formed;

the mask openings include two or more mask openings provided for sub pixels of the same color that are continuously arranged in the one direction;

the mask openings each have a size corresponding to more than two sub pixels of the same color that are continuously arranged in the one direction; and the number of the more than two sub pixels of the same color that are continuously arranged in the one direction is two times or more of a total number of the two or more sub pixels of the same color included in each of the plurality of the pixels.

2. The method for producing a liquid crystal display apparatus according to claim 1, wherein:

the plurality of sub pixels included in each of the plurality of the pixels comprise two sub pixels of the same color; and the more than two of sub pixels of the same color that are continuously arranged in the one direction comprise two sub pixels included in a pixel that includes at least one of the spacers and two sub pixels each included in a respective one of two pixels that do not include any of the spacers.

* * * * *